(12) United States Patent
Andresen et al.

(10) Patent No.: US 7,834,422 B2
(45) Date of Patent: Nov. 16, 2010

(54) IMPLANTED COUNTED DOPANT IONS

(75) Inventors: Soren Andresen, Copenhagen (DK);
Andrew Steven Dzurak, Elizabeth Bay (AU); Eric Gauja, Peakhurst (AU); Sean Hearne, Co. Kildare (IE); Toby Felix Hopf, North Melbourne (AU); David Norman Jamieson, Eltham (AU); Mladen Mitic, Ryde (AU); Steven Prawer, Caulfield (AU); Changyi Yang, Vermont (AU)

(73) Assignee: Qucor Pty. Ltd. (AU)

( * ) Notice: Subject to any disclaimer, the term of this patent is extended or adjusted under 35 U.S.C. 154(b) by 801 days.

(21) Appl. No.: 11/596,720

(22) PCT Filed: May 18, 2005

(86) PCT No.: PCT/AU2005/000706
§ 371 (c)(1),
(2), (4) Date: Jul. 6, 2007

(87) PCT Pub. No.: WO2005/112087
PCT Pub. Date: Nov. 24, 2005

(65) Prior Publication Data
US 2007/0252240 A1      Nov. 1, 2007

(30) Foreign Application Priority Data
May 18, 2004   (AU) ............................... 2004902661

(51) Int. Cl.
*H01L 29/00*   (2006.01)

(52) U.S. Cl. .................. 257/607; 257/609; 438/518
(58) Field of Classification Search ................. 257/607, 257/609; 438/518
See application file for complete search history.

(56) References Cited

U.S. PATENT DOCUMENTS 3,996,655 A * 12/1976 Cunningham et al. ....... 438/279
4,744,616 A *  5/1988 Robinson et al. ............... 385/2

FOREIGN PATENT DOCUMENTS

| JP | 405326437 A | * | 12/1993 |
| JP | 1002-023917 A | | 1/2001 |
| JP | 20011023917 | * | 1/2001 |
| JP | 2002368252 | * | 12/2002 |
| WO | WO 03/019635 A1 | | 3/2003 |

OTHER PUBLICATIONS

English tranlation of Japanese Patent JP 2002368252 by Sasaki ( Dec. 2002).*

(Continued)

*Primary Examiner*—Thinh T Nguyen
(74) *Attorney, Agent, or Firm*—Wood, Phillips, Katz, Clark & Mortimer

(57) ABSTRACT

This invention concerns semiconductor devices of the general type comprising a counted number of dopant atoms (142) implanted in regions of a substrate (158) that are substantially intrinsic semiconductor. One or more doped surface regions (152) of the substrate (158) are metallized to form electrodes (150) and a counted number of dopant ions (142) are implanted in a region of the substantially intrinsic semiconductor.

5 Claims, 14 Drawing Sheets

OTHER PUBLICATIONS

English translation of Japanese Patent JP2001023917 by Iwao (Jan. 2001).*

Miitic M. et al: "Single atom S1 Nanoelectronics Using Controlled Single-Ion Implantation"; Microelectronic Engineering, Elsevier Publishers BV., Amsterdam, NL, vol. 78-79, Mar. 1, 2005, pp. 279-286.

Schenkel T. et al.: "Solid State Quantum Computer Development in Silicon With Single Ion Omplantation", Journal of Applied Physics AIP USA, vol. 94, No. 11, Dec. 1, 2003, pp. 7017-7024.

Gujrathi S. C. et al.: "The Detection of Heavy Ions With Pin Diodes", Nuclear Instruments & Methods in Physics Research, Section B (Beam Interactions with Materials and Atoms), Netherlands, vol. B45, No. 1-4, Jan. 1990, pp. 260-264.

Kamiya T. et al.: "An Automated Single Ion Hit at JAERI Heavy Ion Microbeam to Observe Individual Radiation Damage", Nuclear Instruments & Methods in Physics Research, Section—B: Beam Interactions with Materials and Atoms, Elsevier, Amsterdam, NL, vol. 158, No. 1-4, Sep. 2, 1999, pp. 255-259.

* cited by examiner

IMPLANTED COUNTED DOPANT IONS

TECHNICAL FIELD

This invention concerns semiconductor devices comprising a counted number of dopant atoms (donors or acceptors) implanted in a substrate of substantially intrinsic semiconductor. In a further aspect the invention concerns a method of producing such devices.

Ideally the intrinsic semiconductor should be completely without impurities. In real crystals there will be occasional impurity atoms in the lattice, but provided the impurity atoms do not affect the operation of the device ("substantially intrinsic") they can be tolerated.

BACKGROUND ART

There are many reasons why ions are implanted in substrates, for instance dopant ions are implanted in semiconducting substrates to create electronic devices. As electronic devices become smaller, and in particular as they move towards the utilisation of quantum effects, it is important to be able to control the implantation of small numbers or even single ions.

In particular, as CMOS gate sizes fall below 100 nm, random statistical dopant fluctuations in the channel region give rise to inconsistency in key operating parameters from device to device. This type of problem will become more important for future generations of a range of electronic devices.

Further background art relevant to the invention is acknowledged in the footnoted references, and they are all incorporated herein by reference to form part of the enabling disclosure.

DISCLOSURE OF THE INVENTION

A semiconductor device composing;
a semiconductor substrate;
one or more doped surface regions of the substrate;
metallisation over the doped surface regions to form electrodes; and,
a zone of substantially intrinsic semiconductor where the counted number of dopant ions have been implanted.

The altered properties of the zone of substantially intrinsic semiconductor due to the counted number of dopants are useful in a number of different device applications, as well as being intermediate products in the fabrication of a number of useful devices.

Having more than one doped surface region on the intrinsic substrate can give rise to a PIN (p-type, intrinsic, n-type) architecture for the purpose of detecting single dopant ion implants. The invention is not however, restricted to PIN architectures but also to NIP, NIN and PIP detector architectures, as well as those employing metal Schottky contacts. The dopants could also be metals atoms, as in the case of metal Schottky contacts. Such architectures could be used to facilitate single ion counting. A number of particular examples will now be given:

A PIN detector architecture comprising one or more aluminium surface electrode overlying a p-type (such as Boron) doped surface well in a substrate, and under the substrate an n-type (such as Phosphorus) doped back electrode and a metallic back contact layer. The substrate comprises substantially intrinsic semiconductor in a zone of which there are a counted number of dopant ions.

A metal-oxide-semiconductor-field-effect-transistor (MOSFET) (eg. CMOS) may utilise the invention by comprising two n-doped wells each connected to respective surface electrodes, and each separated from each other by a region of substantially intrinsic semiconductor in which there are a counted number of dopant ions. The structure may have a p-doped back plane. The reverse polarity configuration of p-doped wells and an n-doped back plane may also be used. By accurately counting in the number of dopants in the channel regions of the n-MOS and P-MOS transistors, it is possible to configure CMOS transistors with highly consistent operating parameters (eg. therehold voltage).

A charge qubit device in which counted dopant ions have been implanted.

A dopant cluster device in which clusters of counted dopant ions have been implanted.

An array of any such devices on a semi-conductor wafer.

A method for fabricating a semiconductor, the method comprising the steps of:
doping one or more surface regions of the substrate;
metallising over the doped surface regions to form electrodes;
irradiating a zone of substantially intrinsic semiconductor in the substrate with a beam of dopant ions;
sensing current flow through at least one of the surface electrodes to register the implantation in the zones of substantially intrinsic semiconductor of each of a counted number of ions;
stopping the irradiation when a predetermined number of implanted ions have been registered.

The method may comprise the further steps of:
depositing a layer of ion-stopping resist on a surface of the substrate; and,
nano-patterning the ion-stopping resist to open holes in it above a region of substantially intrinsic semiconductor;

The substrate may be silicon or another semiconductor material. The surface electrodes may be located on the upper surface of the wafer. The resist may be polymethyl-methacrylate (PMMA) sufficiently thick to stop the ions from reaching the substrate; typically 130 or 150 nm, or greater for keV heavy (Z>2) ions. The resist may be developed or etched back to open one or more apertures for implantation. An array of implantation sites may be opened in the resist.

The ion beam source may provide an ion beam of the required dopant atoms, or molecules containing the dopant atom. The ion beam source may be gated on and off by a control system.

Where the ion beam provides molecules containing the dopant ion, the other atoms in the molecule ("bystander" ions) need to be carefully chosen so that they do not disturb the electrical properties of the device. In the case of the ion boron, B, the molecule $BF_3$ is able to be used. In this case each impact delivers one B and three F atoms to the substrate. The F atoms damage the substrate and disrupt the channeling process. The damaged crystal does not channel the B ions so readily and hence the deep tail in the B distribution due to channeling is effectively suppressed. After appropriate processing, the F atoms have no effect on the electrical properties of the substrate.

There are several significant advantages in using molecules. This is because the bystander ions produce significant ionization in the substrate that can aid the sensing of current flow in the electrode.

There are two methods for employing the surface electrodes to make large scale arrays of precisely counted ions. The first is a serial method whereby a Focused Ion Beam (FIB), or a collimated ion beam, from a nanostencil drilled in an Atomic Force Microscope (AFM) cantilever, targets each implant site individually and delivers a counted number of ions to each. This method requires monitoring only one ion impact signal from across the entire substrate.

The second is a parallel method where the implantation is done in parallel to each site via a "smart aperture array" which we define to be an array of individually addressable that can be individually closed on command. This method requires the use of individual detectors for each implant site and a suitable control system.

A smart aperture array may be provided between the ion beam source and the substrate, and apertures of this array may be gated open and closed by the control system. The apertures may be registered with respective ion implantation sites in the resist. The aperture array makes use of DLP technology, electrostatic motors, or tilting apertures.

The ions may be implanted through a thin electrically insulating $SiO_2$ barrier layer, typically thinner than 10 nm, although thicker layers are possible for higher ion beam energies.

The surface electrodes way be set back from the desired implant site by more than 50 microns and stiff allow adequate charge collection efficiency.

A back electrode may be formed on the opposite surface of the substrate to at least one of the other fabricated electrodes.

The back-surface electrode may be reverse biased with respect to at least one other fabricated front-surface electrode to substantially deplete the intrinsic region of charge carriers and fill the construction zone with an electric field. Free carriers created by ion impact, "ionization", can drift in this electric field in the construction zone and can induce a current transient in the electrodes.

The back electrode may be large and could, for example, cover the entire back surface of the semiconductor wafer. The spacing between the surface electrodes may be as large as 100 microns if the resistivity of the substrate is sufficiently high. The substrate resistivity is expected to be high because the substrate is expected to be very pure and high resistivity is an attribute of pure substrates. A reverse bias voltage of more than 10V may be applied between the surface and back electrodes to deplete the intrinsic region. The impact induced charge drift induces a current transient in the electrodes which is integrated to produce a single pulse for each ion strike.

The substrate may be cooled, for instance to temperatures close to that of liquid nitrogen, to reduce detection noise. Part of the control system, in particular a pre-amplifier, may also be cooled to improve the signal to noise ratio.

After ion implantation there may be annealing and activation processes in the temperature range 450-950° C., and perhaps for 5 seconds.

Further electron beam lithography (EBL) steps way be undertaken to make control gates and readout SETs. The control gates may be calibrated for use. Registration markers may be located relative to gate or SET structures to assist in fabrication.

The substrate may be tilted with respect to the ion beam source to reduce the stopping distance of implanting ions.

BRIEF DESCRIPTION OF THC DRAWING

Examples of the invention will now be described with reference to the accompanying drawings, in which.

FIG. 3 [not used]

Figure 4:
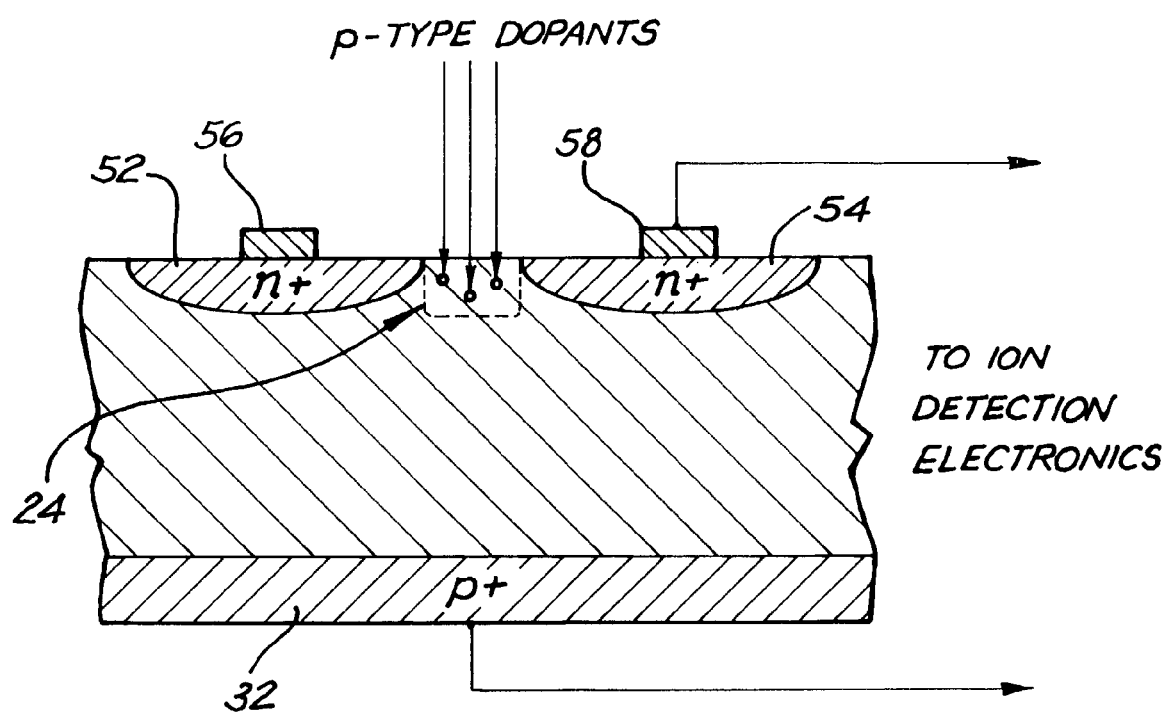

FIG. 4 is a section through an n-MOS transistor intermediate device structure.

Figure 5A:
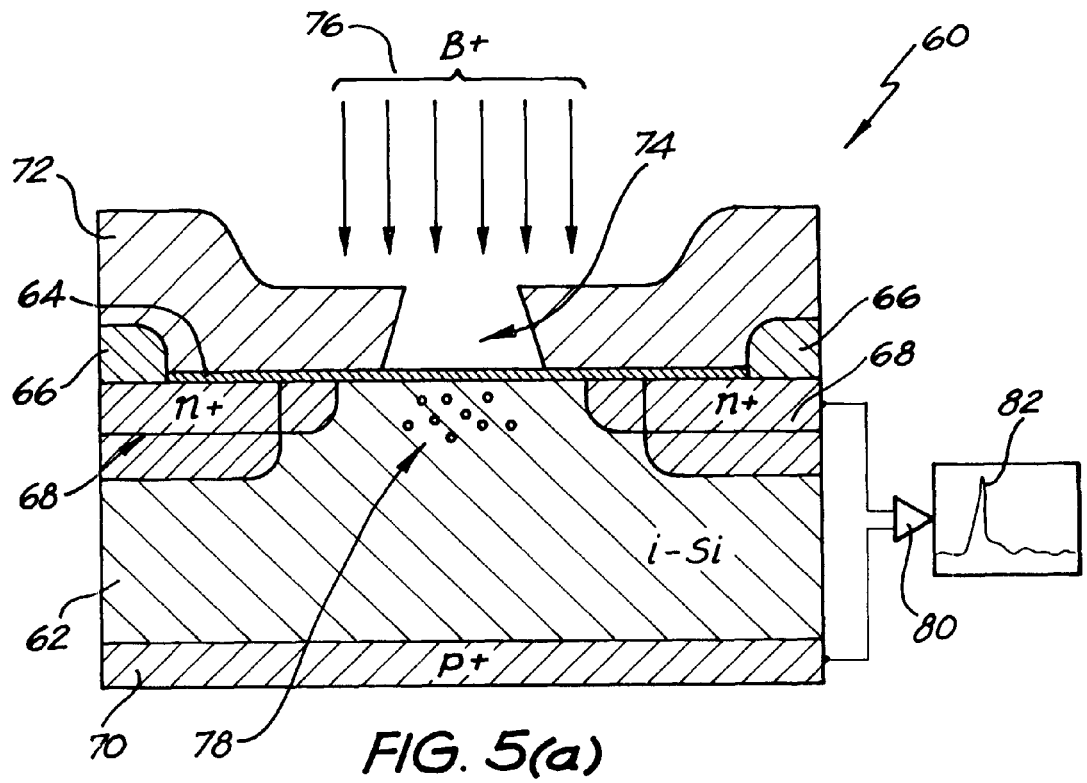

FIGS. 5(a) and 1(b) are cross-sections through a planar n-MOS transistor device showing two stages of fabrication.

Figure 6:
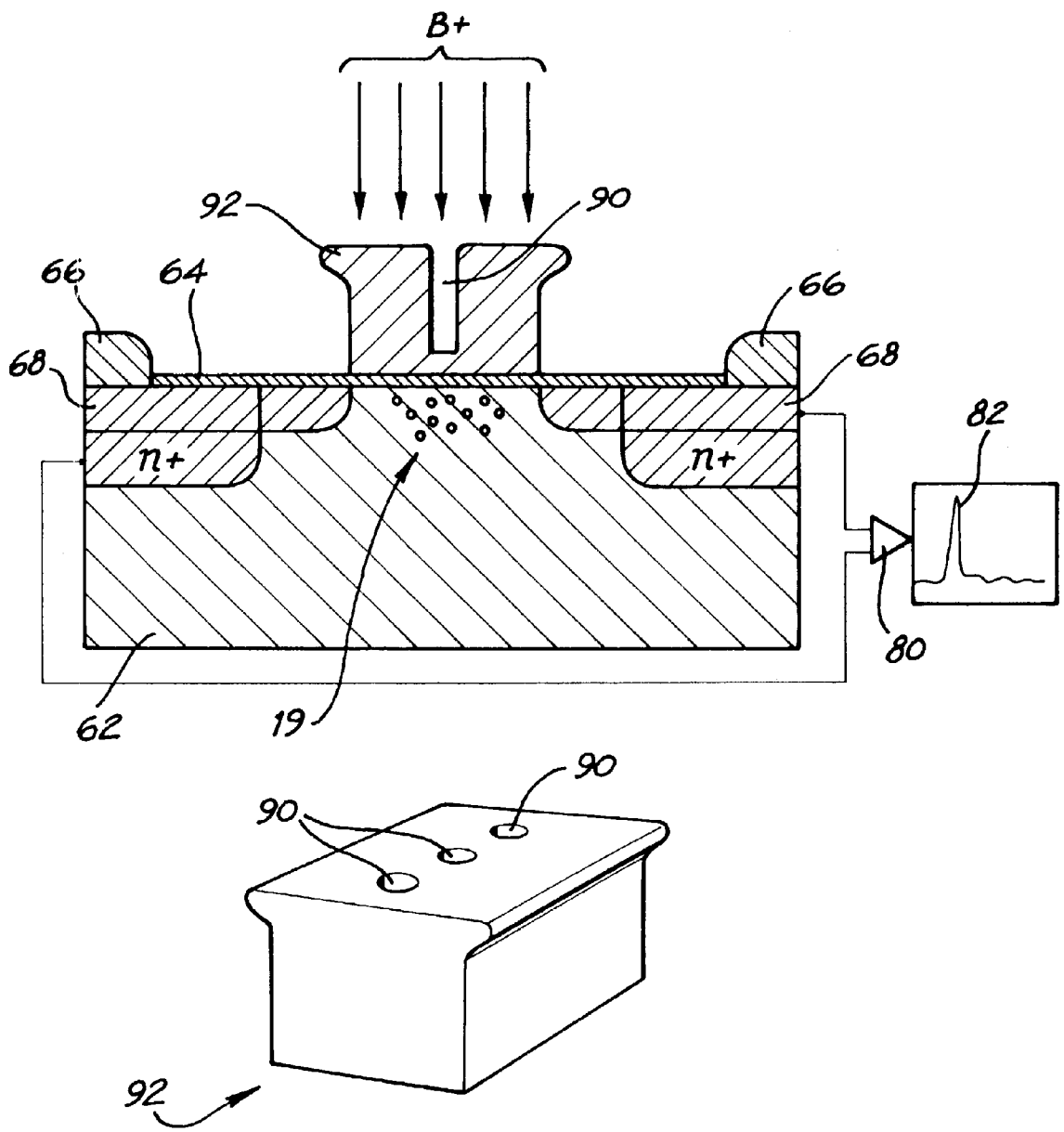

FIG. 6 is a cross-section through a planar n-MOS transistor device, a pictorial inset and a graph, illustrating an alternative fabrication process.

Figure 7A:
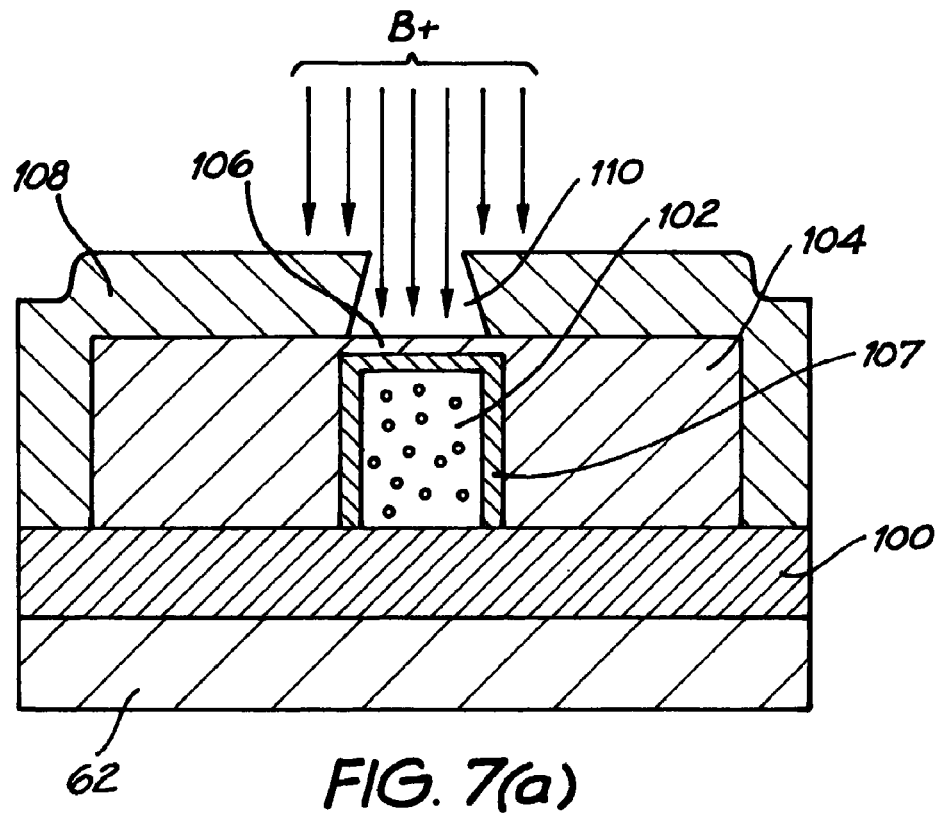

FIG. 7(a) is a cross-section through a three dimensional tri-gate MOSFET illustrating another alternative fabrication technique.

Figure 7B:
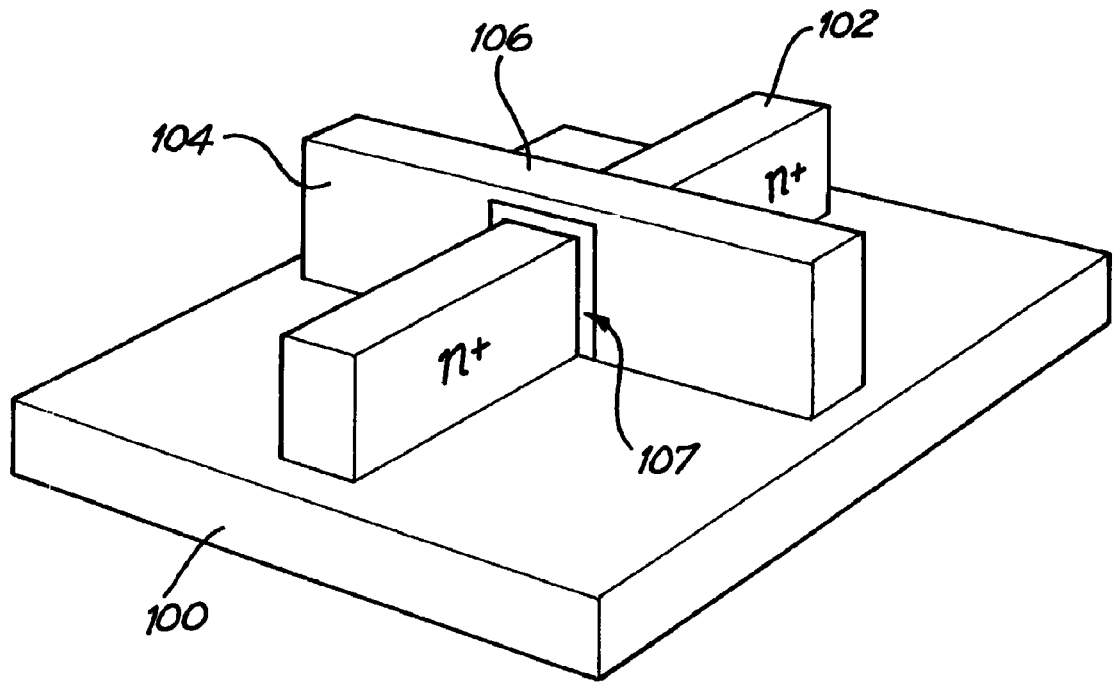

FIG. 7(b) is a pictorial view of the ti-gate MOSFET.

Figure 8A:
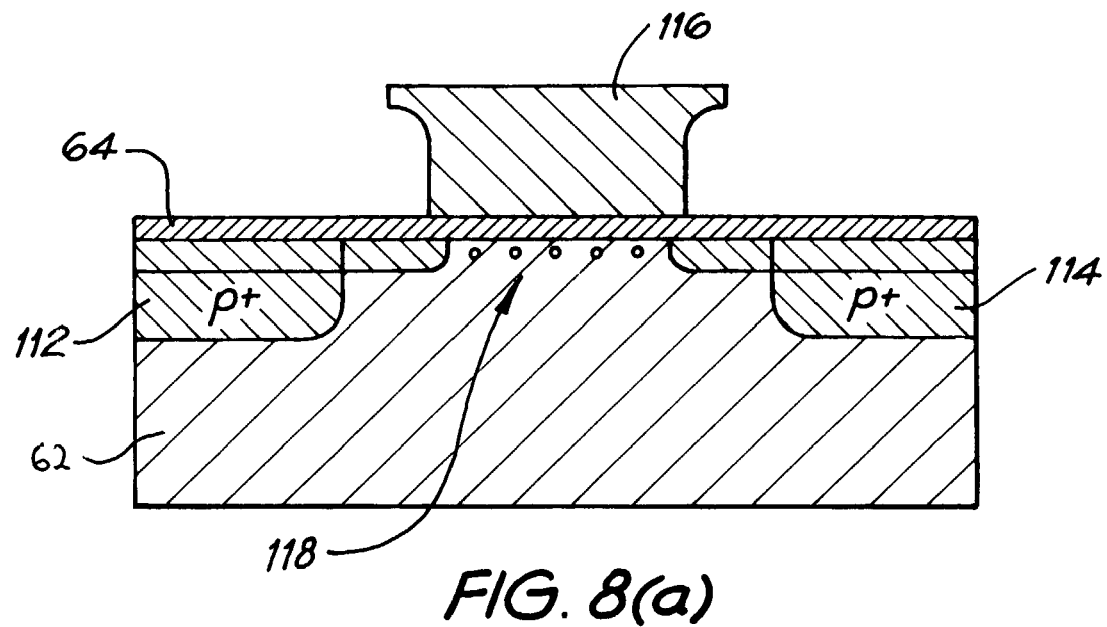

FIG. 8(a) is a cross-section through a MOSFET fabricated with an array of counted dopant atoms.

Figure 8B:
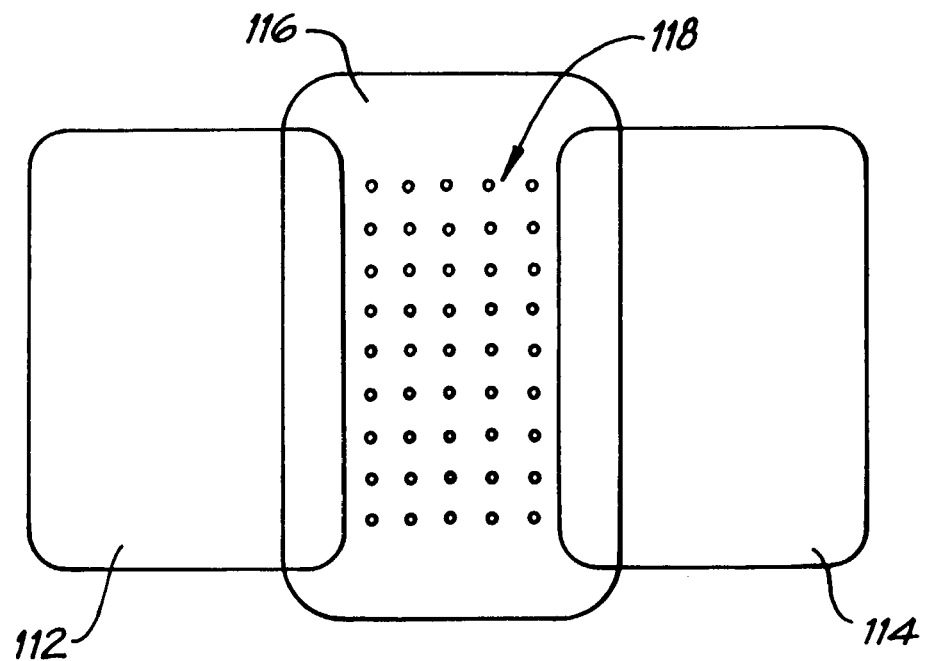

FIG. 8(b) is a plan view of the MOSFET of FIG. 8(a).

Figure 9A:
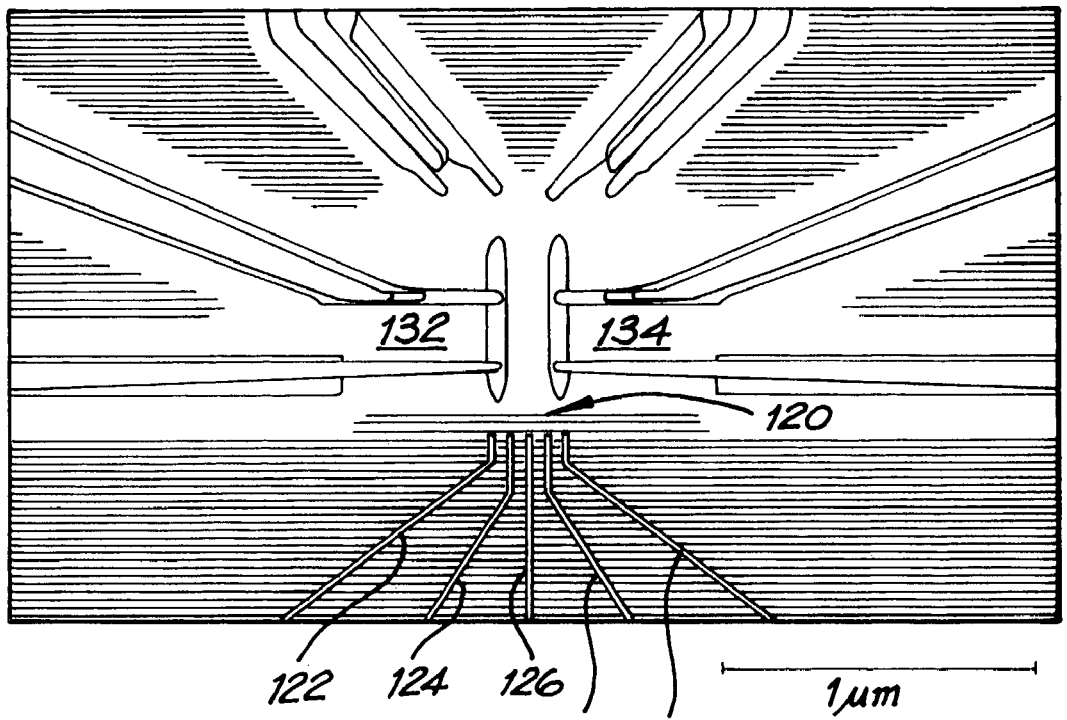

FIG. 9(a) is a diagram of a charge qubit test device.

Figure 9B:
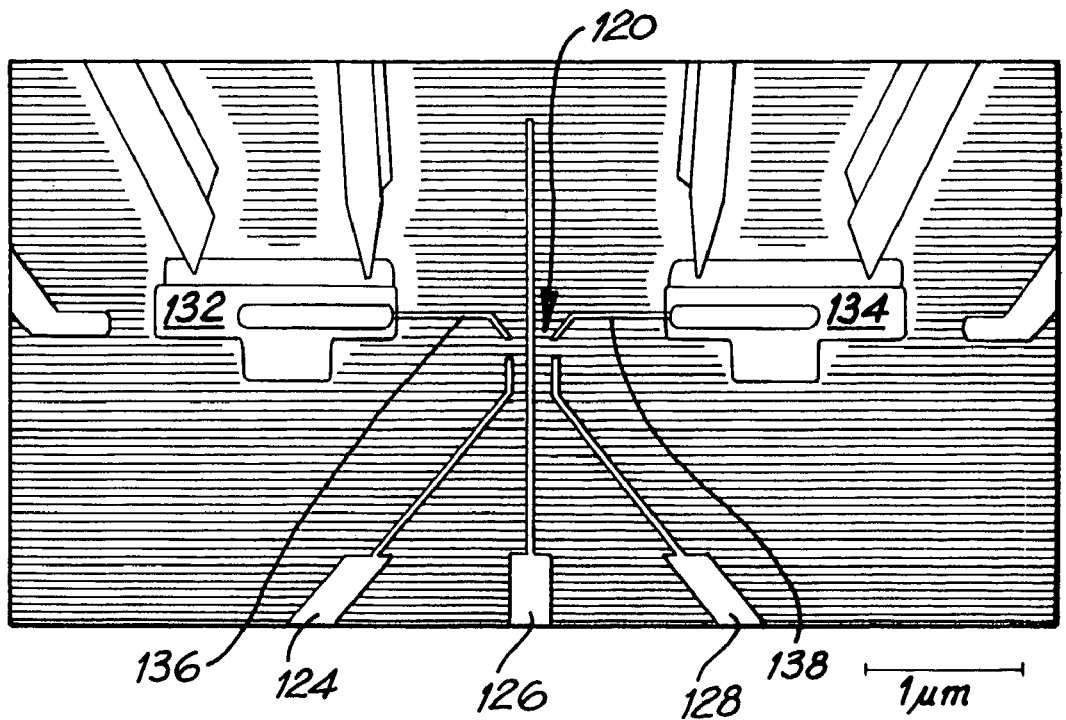

FIG. 9(b) is a diagram of an alternative charge qubit test device.

FIG. 10 [not used]

Figure 11C:
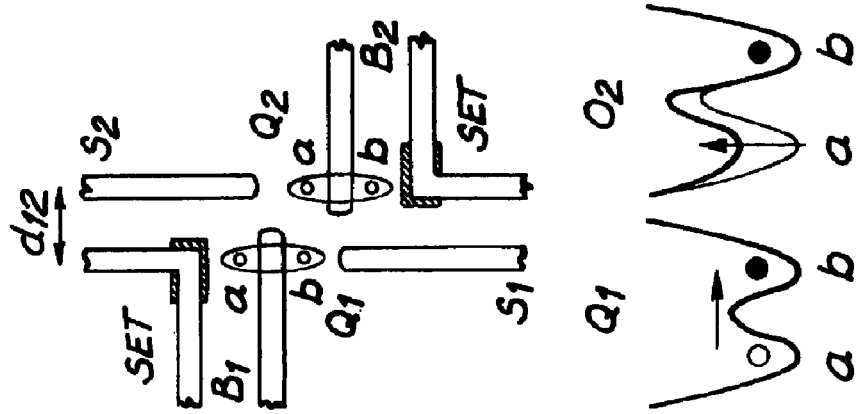
Figure 11B:
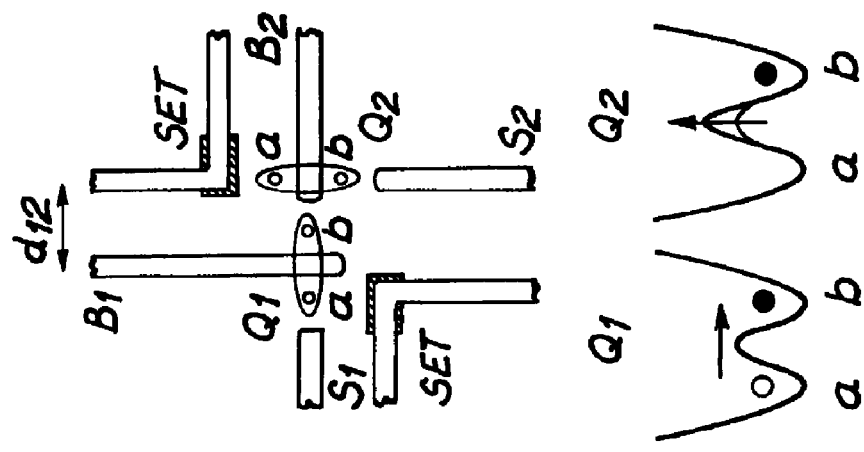
Figure 11A:
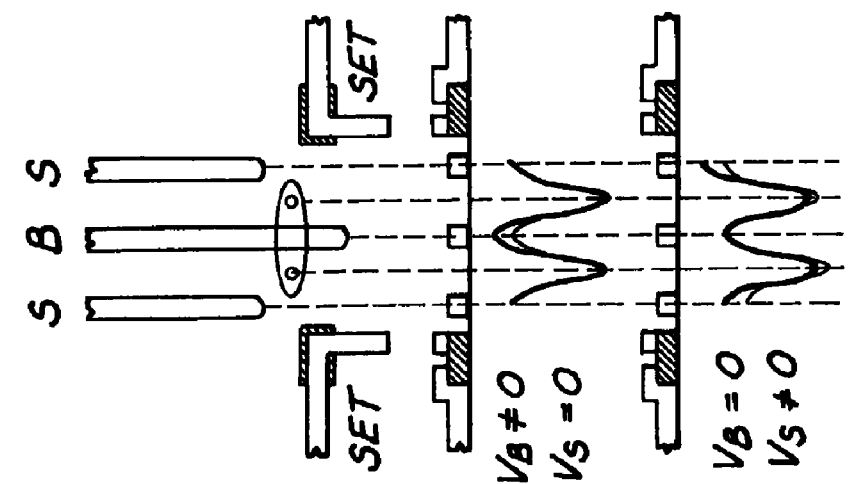

FIG. 11(a) is a series of schematic diagrams of charge qubit device operation.

FIG. 11 (b) is series of schematic diagrams of CNOT operation.

FIG. 11 (c) is a series of schematic diagrams of CPHASE operation.

Figure 12:
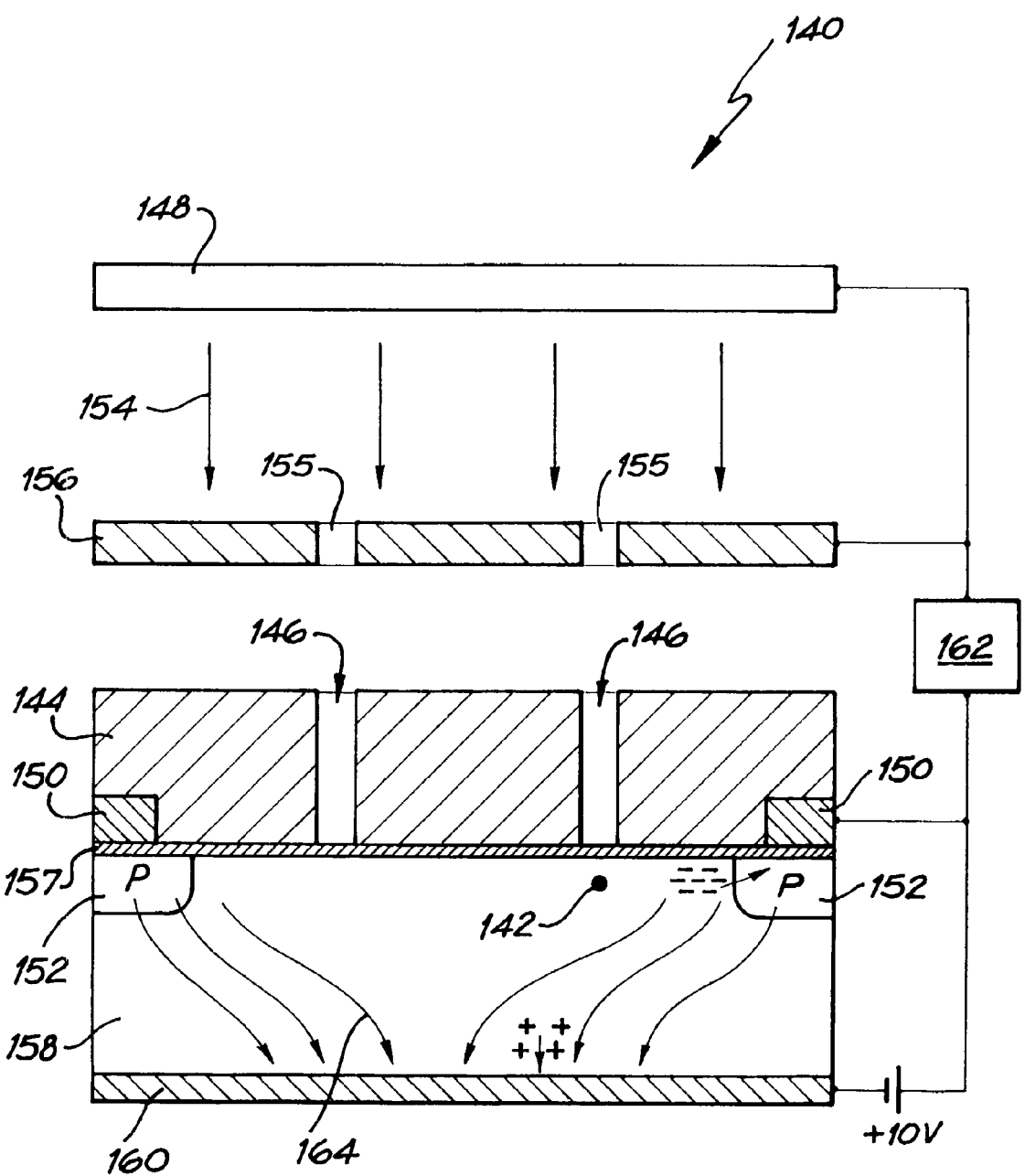

FIG. 12 is a schematic, partly sectioned; diagram of apparatus for counted implantation of ions in a substrate.

Figure 13:
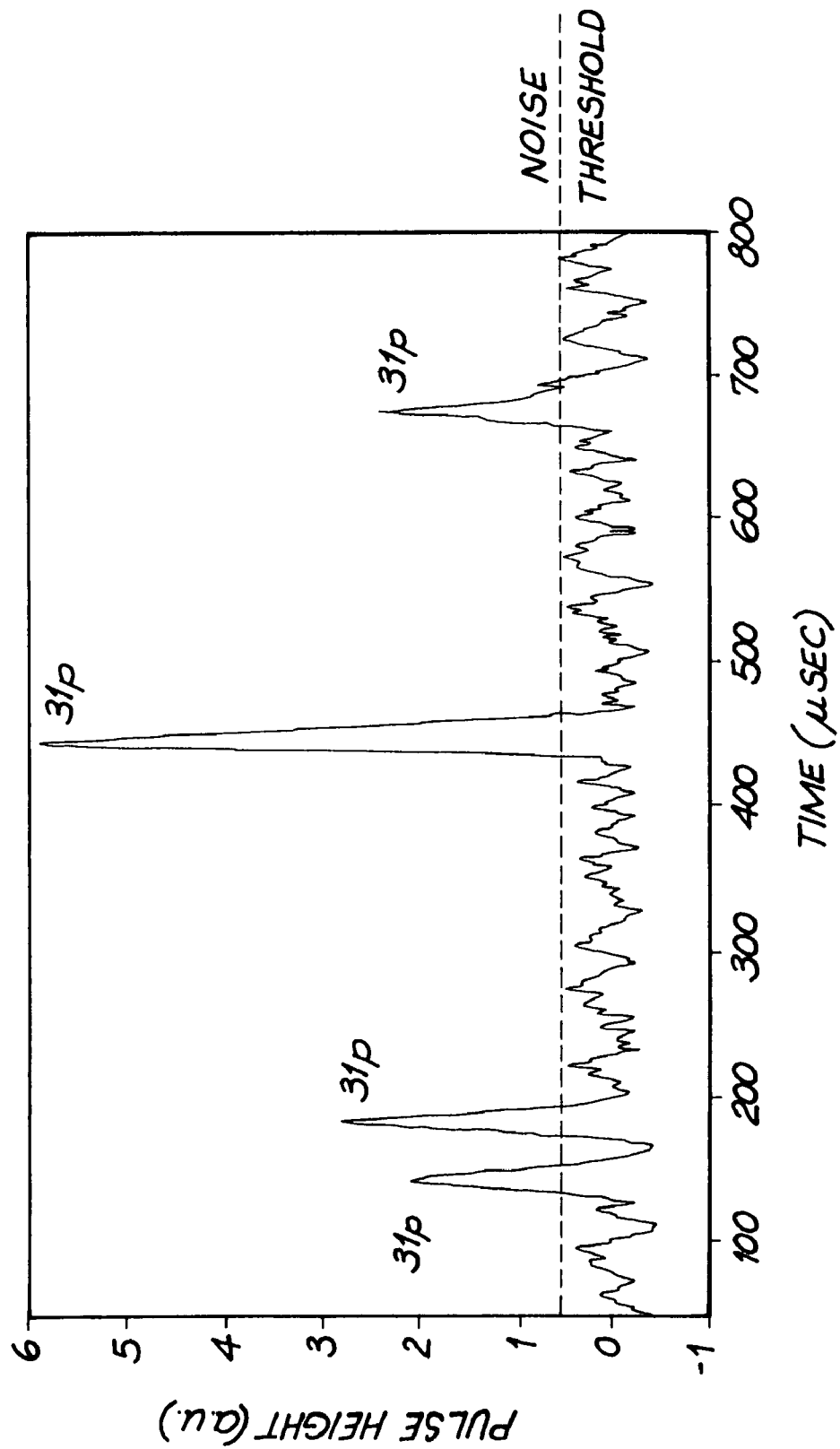

FIG. 13 is a graph of electrical pulses recorded over time, and showing registration of ions arriving in the substrate.

Figure 14:
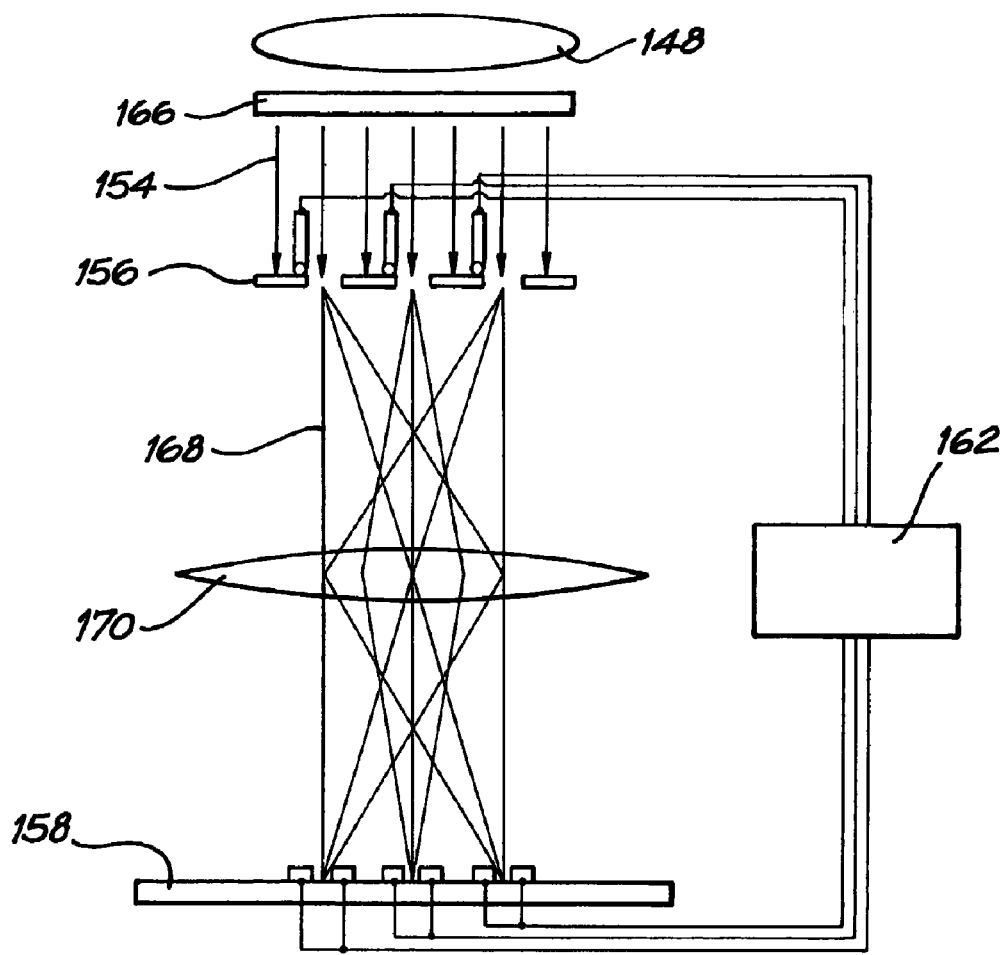

FIG. 14 is a schematic diagram of an apparatus for parallel counted implantation of dopants in a substrate.

Figure 15:
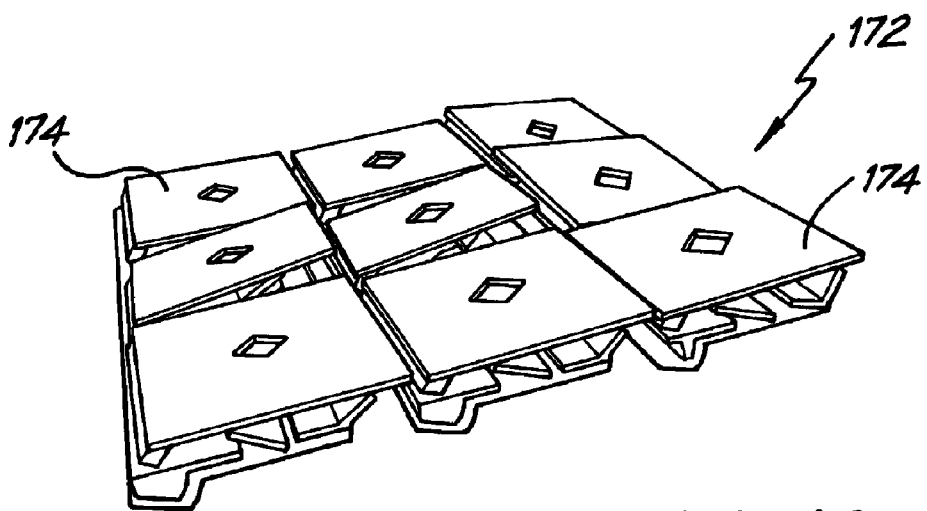

FIG. 15 is an image of a DLP mirror array (from Texas Instruments).

Figure 16A:
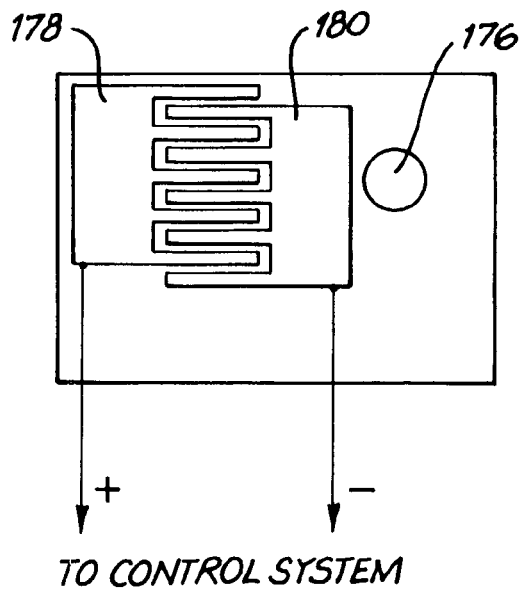
Figure 16B:
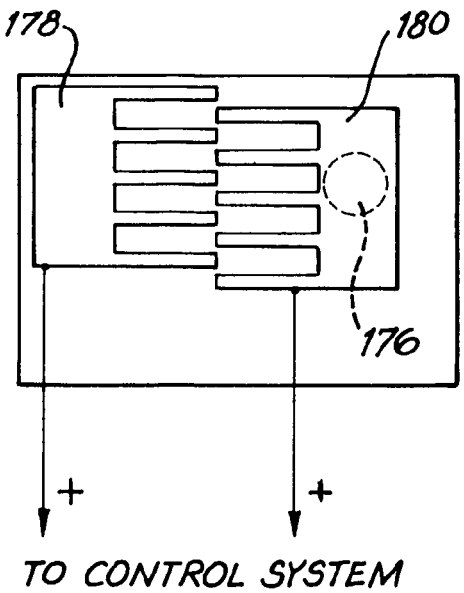

FIG. 16(a) is a schematic diagram of a smart aperture in the open configuration; and FIG. 16(b) is the closed configuration.

Figure 17:
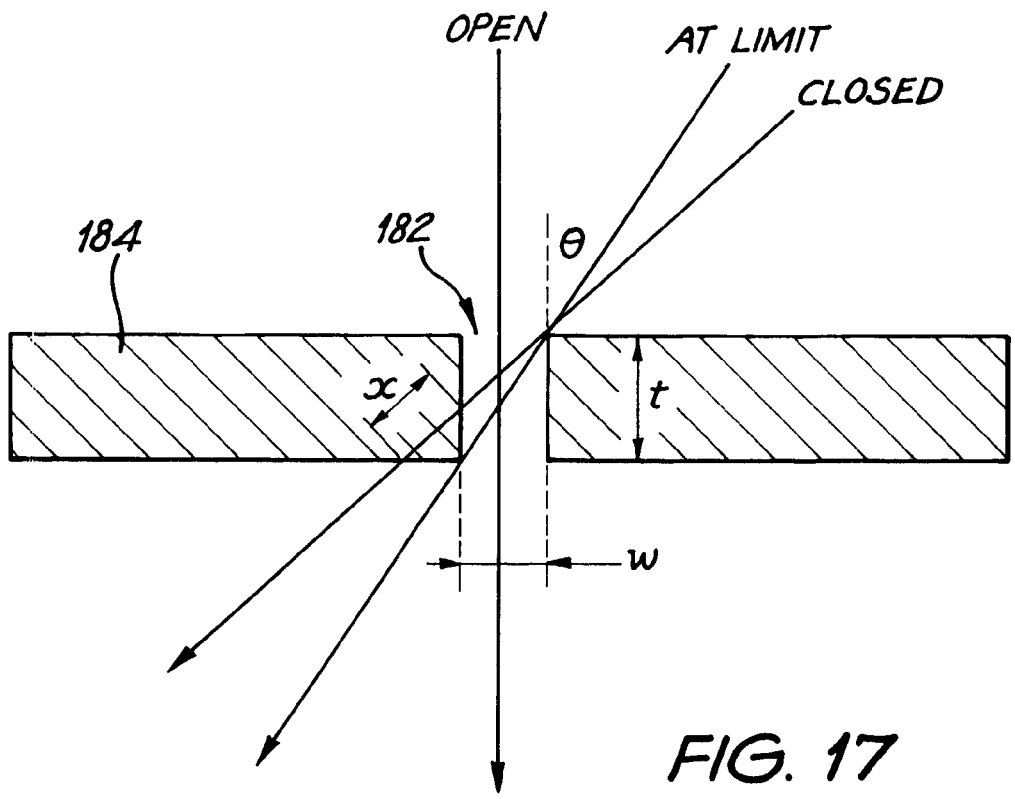

FIG. 17 is a schematic diagram of tilting aperture.

FIG. 18 [not used]

FIG. 19 [not used]

Figure 20:
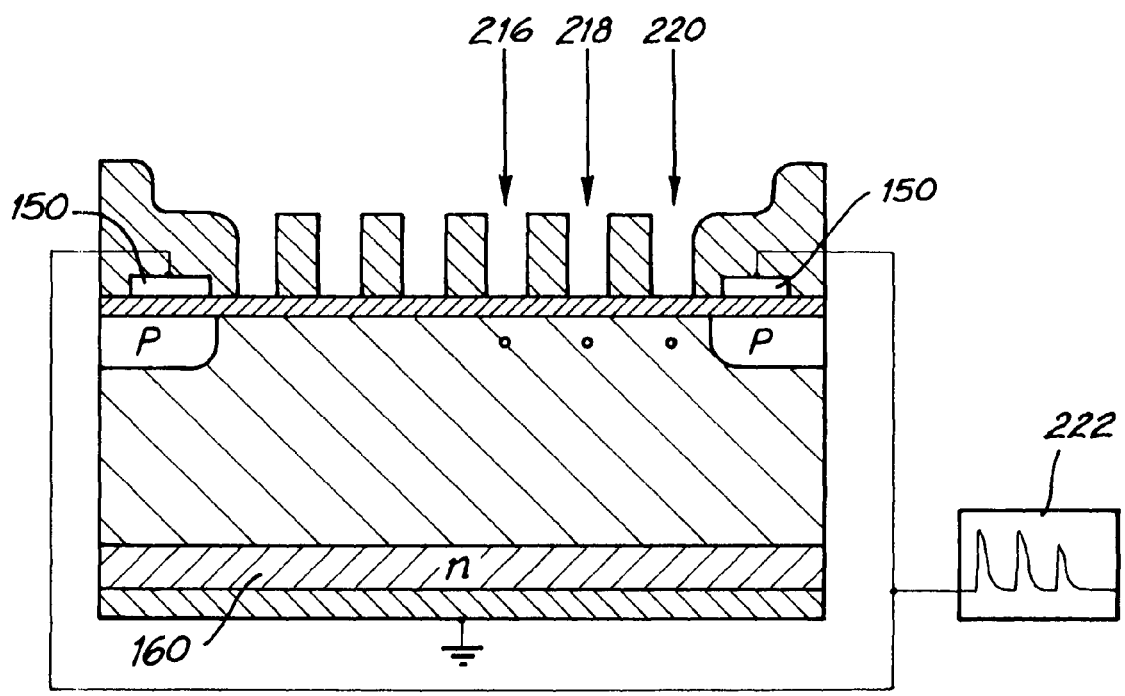

FIG. 20 is a cross-section through a counted dopant device showing use of a focused ion beam to produce a precise array of dopant atoms in the channel.

Figure 21:
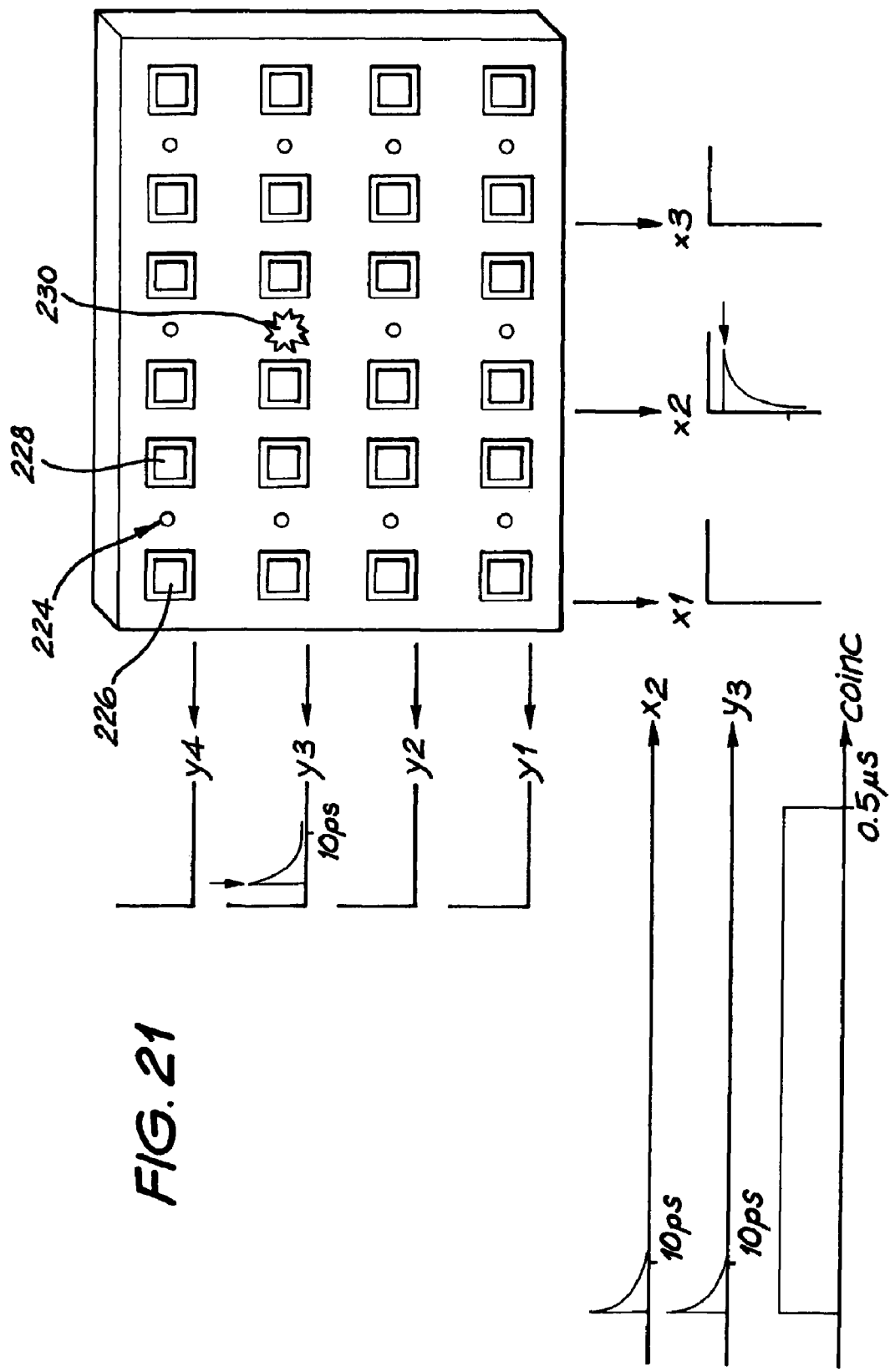

FIG. 21 is a schematic diagram showing an arrangement for ion strike readout timing.

BEST MODES OF THE INVENTION

The invention may be exemplified in a wide range of detector architectures and fabricated counted dopant devices:

PIN Ion-Detector Structures

Figure 1:
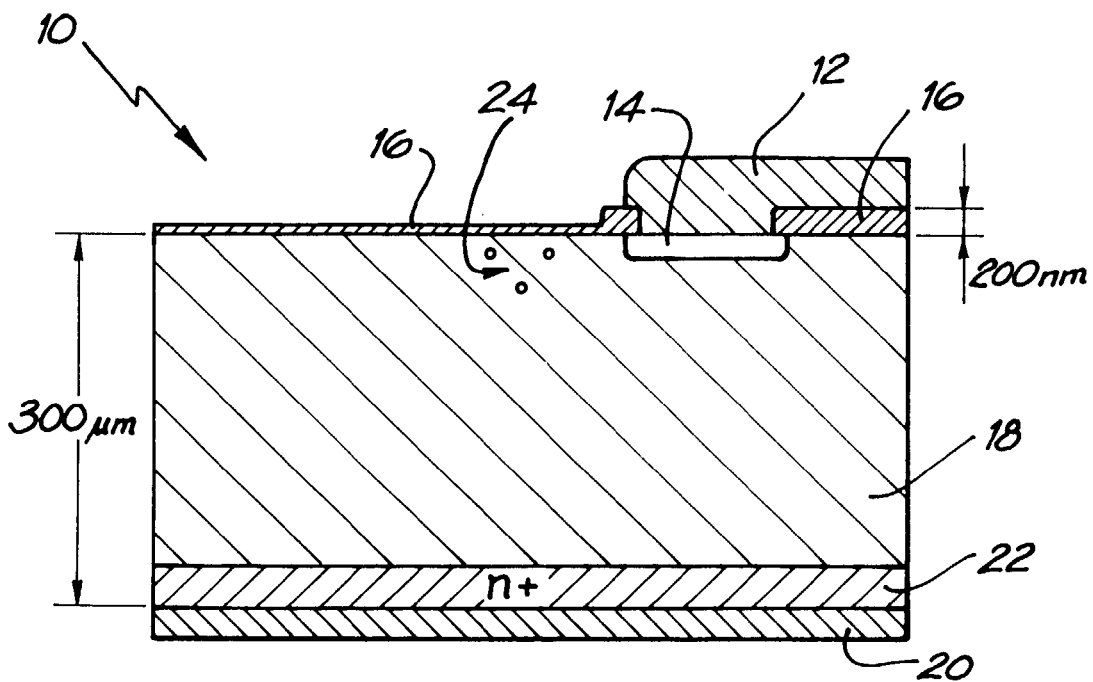
FIG. 1 is a section through a PIN structure with one surface electrode

Two variations of PIN detector structures were investigated. The first 10 is shown in FIG. 1 and comprises a surface aluminium electrode 12 overlying a p-type (such as Boron) doped surface well 14, an insulating layer 16, a substrate 18, a back contact layer 20 and au n-type (such as Phosphorus) doped back electrode 22. A counted number of p-type dopant ions 24, are introduced into the substrate 18 in the construction zone which extends out to about 25 microns from the edge of the electrodes.

Figure 2:
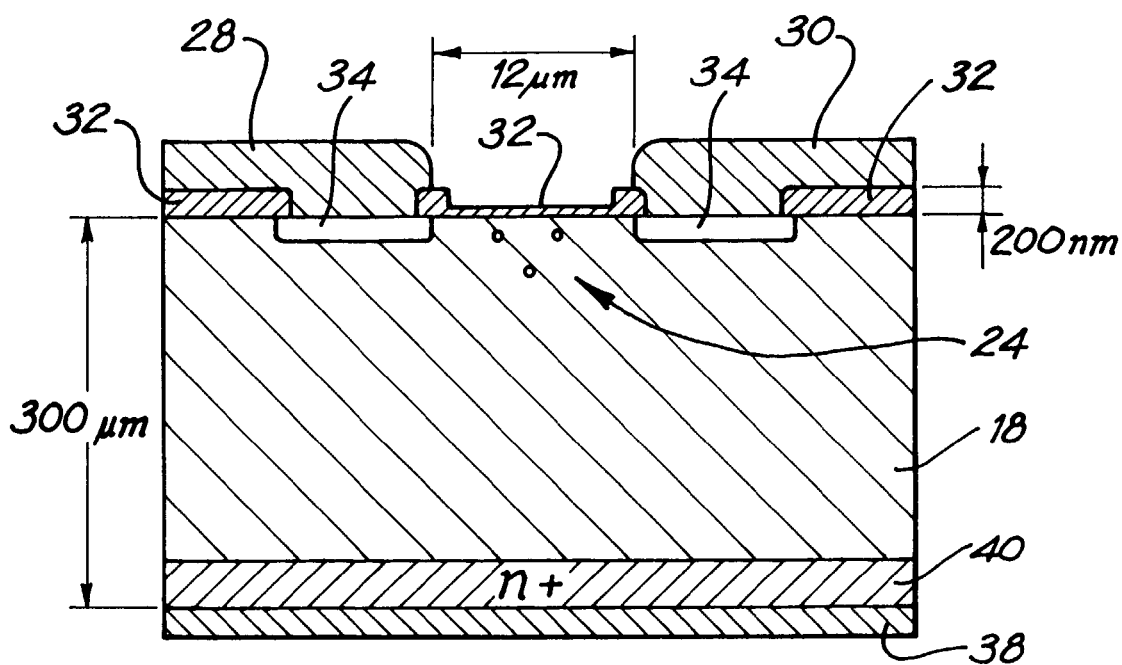
FIG. 2 is a section through a PIN structure with two surface electrodes.

The second is shown in FIG. 2 and comprises two surface electrodes 28 and 30 separated by an insulated layer 32. This device gives a construction zone with a larger area than the previous device. Each electrode is positioned over a p-type (such as Boron) doped surface well 34 and 36 respectively. There is also a back contact layer 38 and an n-type (such as Phosphorus) doped back electrode 40. Again a counted number of dopant ions 24 are introduced into the substrate 18.

The PIN devices were made to have a low leakage current with high reproducibility. They are compatible with the charge transient detection electronics, and produced detection pulse shapes closer to the ideal shape expected. The system was insensitive to the preset parameters of the preamplifier system greatly simplifying operation of the device. They gave close to ideal behaviour over a wide range of operating parameters. The detectors were also insensitive to microphonics so random noise events in the laboratory did not induce noise in the system. The PIN detectors could withstand a considerably higher bias voltage compared to Schottky MOS detectors without breaking down. This expands the high charge collection efficiency region. Tests with the nuclear microprobe revealed high charge collection efficiency in the construction site.

Assembly of Counted Dopant MOSFETs

The PIN ion detection system described above is similar to the structure of a n-MOS or p-MOS field-effect-transistor if the gate structure is removed or is absent prior to the gate fabrication processing step in a production line; see FIG. 4 which shows an n-MOS transistor comprising two n-doped wells 52 and 54 connected to electrodes 56 and 58 respectively, and separated by a region 94 to be doped with p-type dopants, and a p-doped back plane 32. Therefore the invention is able to be incorporated into the process for fabricating a real device by employing it at an intermediate stage of fabrication, as an ion detection system for registering the dopant ion strikes in the region. A counted number of dopant ions 24 are introduced into the substrate.

TCAD simulations show that the electric field distribution is very similar to the fields in the standard PIN devices discussed earlier. Even more important, the charge collection efficiency of the device appears to be close to 100%.

Referring first to FIG. 5(a) planar MOSFET 60 comprises an activated silicon substrate 62 under a thin oxide layer 64 of a few nanometers thick. Variations in the Si—SiO$_2$ interface quality should be much smaller than any expected dopant related variations. Two ohmic contacts 66 penetrate the oxide layer 64 and sit over N$^+$ drain and source electrode regions 68. A P$^+$ doped back contact layer 70 is at the back of the wafer.

A thick layer of resist 72 sits over the top of the structure and is penetrated by an overhanging aperture at 74. The device is irradiated with a parallel beam of dopant ions 76 and some of the boron ions pass into the aperture 74 and penetrate through the surface oxide layer into the silicon substrate at 78. The arrival of each ion induces electrical current to flow between the N$^+$ electrodes 68 and P$^+$ back contact layer 70. This current passes through a preamplifier 80 to record a current spike 82 each time one of the boron ions enters the substrate 62. The current spike is used to control the ion beam, so that a counted number of boron ions can be introduced into the region 78.

Figure 5B:
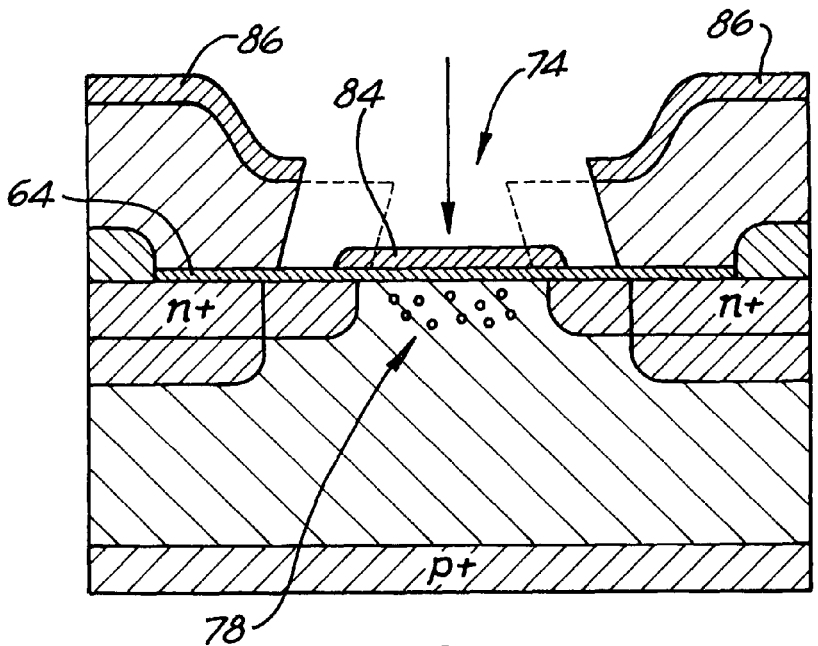

Following the implantation step a polysilicon or metal gate 84 is deposited on top of the oxide layer 64 above region 78, as shown in FIG. 5(b). The gate material is deposited vertically as indicated by the arrow in FIG. 5(b), and covers, at 86, the surface of the resist 72 as well as entering through the aperture 74 to form the gate 84. The resist is generally cut back to enlarge aperture 74 before deposition of the gate 84, in order to size the gate appropriately. It should be noted that the gate is automatically aligned above the implanted ions by using the same aperture 74.

FIG. 6 illustrates an alternative arrangement in which there is no back plane or resist layer, but the ions are implanted at the end of fabrication through apertures 90 formed in the gate structure 92 that has been fabricated on a MOSFET. In this case an electrical circuit is established between the two N+ electrode regions in order to identify the electrical current spike 82 associated with each ion strike event and so control implantation.

FIG. 7(a) illustrates a further alternative in which the silicon substrate sits under a BOX layer 100 that is typically 200 nm thick. Above this is an active silicon channel region 102 and a polysilicon tri-gate 104 which travels across the top of the intrinsic silicon channel region 102 to form a thin bridge 106. A layer of oxide 107 separates channel 102 and gate 104. A layer of resist 108 covers this gate structure and an overhanging aperture 110 allows a beam of B$^+$ ions to be directed vertically down onto the structure. Some of the B+ ions will enter through aperture 110, and some of those will penetrate the bridge 106 to enter the silicon channel region 102. FIG. 7(b) illustrates the final device, commonly referred to as a FINFET. The thick gates allow low resistance contact to be made with the MOSFET device. This process can be used to accurately dope the central channel of the FINFET, or the regions of the source and drain contacts closest to the channel (the latter referred to as "source-drain extensions").

FIG. 8 illustrates a further example in which the intrinsic silicon substrate 62 has a P$^+$ source 112 and drain 114 fabricated below the oxide layer 12 and a gate structure 116 is fabricated on top of the oxide layer. Single phosphorus atoms are imparted at 118 through the gate 116 and oxide layer to form a regular array of dopant atoms in the substrate at 118.

In the fabrication of all these devices the use of the source and drain electrodes to provide the current that signals an ion strike avoids the need for further integrated on-chip components.

Charge Qubit Devices

These devices require two dopant atoms. At the mean distance apart of 60 nm we calculate [11] qubit rotation times of ~200 ps using accessible B-gate voltages, becoming faster for smaller spacings. For initial two-dopant devices ~40% of P-P pairs will be separated by less than 60 nm, giving functional cubits. We have fabricated resist apertures as small as 15 nm and expect that centre-to-centre spacings of 30 nm can be achieved. In such structures all pair spacings would be below 70 nm, providing a high yield of operational qubits for large scale systems.

Charge Qubit & Dopant Cluster Devices

We describe how our method is compatible with the fabrication of charge qubit devices containing two dopants and devices which contain clusters of dopants. We have fabricated cluster devices in which the two dopants are replaced by implanted clusters of phosphorus donors, effectively creating two buried metallic islands. FIG. 9(a) shows devices incorporating two such clusters buried 20 nm below the surface at 120, accurately aligned to control gates 122, 124, 126, 128 and 130 and dual readout SETs 132 and 134. We calculate that approximately six hundred donors are required in each cluster to create a metallic density of states separated by a barrier, enabling periodic sequential tunneling between clusters upon application of a differential bias between the surface control gates. The two read-out SETs may then be used to detect this periodic charge motion. The presence of a periodic output signal in test devices provides an unequivocal demonstration of controlled electron transfer, while the large number of implanted dopants minimises the detrimental effects of any traps in the i-Si substrate or at the Si/SiO$_2$ interface.

The charge qubit device employs two symmetric SETs 132 and 134 to read out electron position within a single P-P$^+$ qubit. Whilst in principle a single SET would suffice, by cross-correlating the output from two SETs it is possible to reject spurious events resulting from random charge motion within the Si substrate, the SiO$_2$ barrier layer, or associated with the SETs themselves. Such charge noise rejection has been demonstrated [13] using an all-aluminium twin-SET architecture in which the phosphorus donors are simulated by two aluminium islands separated by a tunnel junction.

In the device of FIG. 9(a) each SET is designed to capacitively couple most strongly to its nearest donor cluster. Preliminary measurements, however, indicate significant cross-coupling between SETs making signal discrimination difficult, and it was necessary to reconfigure the device with the two SETs separated from each other by around 1 μm as shown in FIG. 9(b).

In the alternative arrangement of FIG. 9(b) each SET island 132 and 134 has a respective coupling electrode 136 and 13S to capacitively couple it to a donor site. The long central barrier "B" gate 106 is used to control tunneling between the donors.

Fabrication of the devices in FIG. 9 involves a number of high-resolution electron beam lithography (EBL) steps, each of which must be aligned to the others with an accuracy of 20 nm or better, to ensure reliable gate control and sufficient capacitive coupling between the donors and read-out SETs. The process flow proceeds as follows:

Firstly, a barrier between the control gates and donors is provided by a 5 nm SiO$_2$ layer, thermally grown on a near-intrinsic silicon wafer with a background n-doping level of $10^{12}$ cm$^{-3}$.

If single ion implant control is required, micron-scale aluminium detector electrodes 150 and 152 are then deposited on the substrate using UV lithography; see FIG. 12. The electrodes are separated from each other by 50 μm, sufficiently close to ensure high-efficiency charge collection, but far enough apart to allow all nanocircuitry to be constructed between them. We note that for the fabrication of test devices with large numbers of P atoms, single ion counting was not required as the cluster size could be determined sufficiently accurately from the incident ion flux and resist-aperture diameter.

To provide sub-20 nm registration between all features of the device, EBL is then used to pattern a number of Ti/Pt alignment markers on the chip. In a second EBL step, two sub-30 nm apertures are opened in an ion-stopping PMMA resist, as depicted schematically in FIG. 12. Metallisation and lift-off results confirm the dimensions of these apertures.

Donor implantation proceeds next using a 14 keV P$^+$ ion beam. Modeling [12] indicates that these ions come to rest in the PMMA at a mean depth of 38 nm, with standard deviation 10 nm, so a layer thickness above 100 nm is sufficient to block phosphorus ions and avoid forward recoils of atoms constituting the resist. Phosphorus ions which pass through the apertures and enter the substrate come to rest at a mean depth of 20 nm below the free surface.

Damage to the substrate caused by the implant process is removed via a thermal treatment. We employ a 950° C. rapid thermal anneal (RTA) for 5 seconds, sufficient to activate the phosphorus donors [5] but limiting their diffusion to ~1 nm based on standard bulk rates [6]. Pulsed laser annealing on ms timescales could also be used to further limit phosphorus diffusion and to localise the region of heating.

Following ion implantation and activation, the remaining nanocircuitry on the surface of the chip is completed using two further EBL steps. Firstly, Ti/Au control gates are deposited following EBL patterning of a single PMMA layer. We routinely fabricate gate widths of 20-30 nm using this process [7] and have also demonstrated continuous gates as narrow as 12 nm. Finally, the two Al/Al$_2$O$_3$ SETs are fabricated using a double-angle metallisation process and a bilayer resist [8]. As seen in FIG. 9(a), the overall alignment between all levels of this process is better than the width of a control gate (~20 nm).

Large Qubit Arrays

Long linear rays of charge qubits can be envisaged [11] with "CPHASE" coupling as in FIG. 11(c). Such devices would require a focused phosphorus ion beam combined with an EBL-defied resist aperture mask to position each dopant at the appropriate array site in a step-and-repeat process.

It will be necessary to minimise defects at the Si/SiO$_2$ interface which could trap the sole electron in the qubit. Interface trap densities below $10^9$ cm$^{-2}$ have been reported [19] that correspond to trap spacings in excess of 300 nm, sufficient for qubit operation, however, such interfaces require high levels of purity daring oxide growth.

Apparatus for Constructing Counted Dopant Devices

FIG. 12 depicts generalised apparatus 140 used to localize individual phosphorus atoms 142 at desired qubit array sites. The device structure is similar to that of FIG. 2. A nano-patterned ion-stopping resist 144 such as polymethyl-methacrylate (PMMA). The nano-patterning open holes 146 in the resist that define ion implantation sites. A beam of dopant ions, for example a low-energy 14 keV $^{31}$P$^+$ ion beam 148 could be used to supply P dopants, passes 154 through closable apertures 155 in an aperture array 156. The closable apertures 155 are aligned above the holes 146 in the resist layer 144. The P dopants 20 are can be implanted trough any surface oxide layers, for example a thin, less than 7 nm thick, SiO$_2$ barrier layer 157, to a mean depth of 20 nm into the substrate 158. There are two surface electrodes 150 overlying p-doped regions 152, and a back electrode 160. A control system 162 is connected between the electrodes 150, 152 and 160, and the source 148 or aperture array 156 to stop further irradiation of the substrate when the desired number of ions have been implanted through the resist 144 by closing the respective apertures 155; for the quantum computer this will be one ion through each aperture.

Bias Configuration

The two surface electrodes 150 are connected together and then biased against the back electrode 160. The electric field extends in the plane normal to the page, and as a result the entire volume of the device construction zone is filled with electric field, indicated by field lines 164. This causes all the ion-induced charge to drift to the electrodes leading to charge collection efficiencies of close to 100%; small loses still occur in the surface oxide layer 157. The ion detection efficiency may be verified by scanning the device with a nuclear microprobe and mapping the charge collection efficiency.

The separation of the two surface electrodes 150 can be increased provided the resistivity of the substrate 158 is increased. It may be possible to have the gap between the electrodes as high as 100 microns if the resistivity of the substrate is sufficiently high.

The two surface aluminium detector electrodes 150, biased at up to 10 V against the back electrode 160 restricts the dark current (that is the current flowing when there is no ion beam) to below 100 pA. Each ion entering the substrate creates ~500 e$^-$/h$^+$ pairs which drift in the internal electric field produced by the electrode bias. The e$^-$/h$^+$ pair generation and separation mechanism has been modelled [1] using the semiconductor modeling packages SRIM [2] and TCAD [3] and is found to create a current transient with a time constant of 40 ps.

Implantation Detection

Because of their mass, $^{31}$P$^+$ ions with incident energy 14 keV contribute about 5.8 keV to the creation of e$^-$/h$^+$ pairs. Data for a 14 keV $^{31}$P$^+$ ion beam incident in an interdigitated electrode away with lateral dimension ~100 micron, is shown in FIG. 13. Pulses 200 above the noise threshold occur at a frequency consistent with the ion dose across the active device area and can therefore be identified as single ion strikes. Due to statistical variations in ion trajectories the exact number of $e^-/h^+$ pairs and the resulting pulse height will vary between events.

Analysis of a large number of pulses shows a gaussian distribution of peak heights arising from a large number of single ion impacts. The temporal broadening of the signals in FIG. 13 results from the time constant of the detection circuit.

In some cases, the ion implantation site will be located in a narrow strip of material that is electrically isolated from its surroundings. In this case it is possible to use an alternative technique for registering ion impact events. If the volume of the material is sufficiently small, the impact of a single ion will create sufficient damage to significantly change the resistivity of the volume. Consequently measurement of the resistivity of the narrow strip of material using the surface electrodes could reveal single ion impacts by discrete steps in the resistivity as a function of time during ion irradiation.

In any event, the current is integrated in an external, high efficiency preamplifier circuit 162 (see FIG. 12) to produce a single pulse for each ion strike.

Aperture Array

An aperture array 156 (see FIG. 12) is used for ion implantation of large-scale devices with many "counted ion-implantation" sites on the same chip. A number of possible aperture arrays may be used. Each contains individually controlled apertures that can be used to deliver a counted ion dose to specific sites on the substrate.

The basic elements of the smart aperture array are shown in FIG. 14. An ion beam 154 from a high brightness source 148 is focused with a condenser lens 166 onto the smart aperture array 156. Beams diverging from the apertures 168 are focused onto the substrate 158 with a high precision lens system 170 such as that used in the probe forming lens system of a Focused Ion Beam (FIB). As control system using 162 the single ion detection system is wired to detector electrodes at each implant site. These detectors are sensitive only to implant events in their associated implant site and do not suffer from crosstalk due to events in other sites. Once the correct number of ions are counted, the control system 162 closes the associated aperture 156.

DLP Smart Apertures

In a DLP chip 172, thousands of individual electrostatically controlled mirrors 174 are used to generate images by reflecting light onto, or away from, a screen, see FIG. 15 from Texas Instruments. The TI DLP chip typically has surface mounted mirrors that can tilt over a range of +/−7°. By drilling each mirror with an aperture using a FIB, or otherwise, this chip would be suitable for use as a smart aperture. Etching away the substrate beneath the mirror would also be required. Rotation of the mirror would open or close the associated aperture. The mirrors can be quite thick, up to 50 microns, making the system very robust to ion implantation damage which would typically only affect the top few 10 s of nanometers for the envisaged applications. The mirrors hinge on single crystal silicon hinges which are also quite robust. However the smart aperture would need to be replaced from time to time before the ion implantation made its operation unreliable.

Others

Magnetically flipped mirror arrays are also reported in the literature that operate over the full 90° and could be employed to make smart apertures without major modification.

There are several alternative MEMS devices that have individually addressable micro- or nano-scale elements that could form the basis of a smart aperture array. For instance see FIGS. 16(a) and (b) where an aperture 176 is revealed and closed by controlled electrostatic attraction and repulsion of two interdigitated arrays 176 and 180.

Tilted Aperture

Here we present the design of a smart aperture that could be formed by drilling a hole 182 in a slab of silicon 184 (such as one pixel of a TI DLP chip) that can be tilted through a small angle, see FIG. 17. For apertures with a large aspect ratio the tilt angle needed to shut off the beam is small, a few degrees, hence this can be accomplished rapidly which is desirable for the smart aperture concept. In fact the TI DLP chip tilts the mirrors around 7 degrees at kHz frequencies which indicates that this is a well established technology.

In FIG. 17 the ion beam ray trajectories are shown tilted. In practice the direction of the ion beam would remain fixed and the aperture slab would be tilted using external control of electrostatic forces. The figure shows three ion trajectories through the aperture as a function of tilt angle, θ. When the aperture is closed, the path length through the wall of the aperture, x, is greater than the range of the ion beam in the material. As a function of the slab thickness, t, aperture diameter, w, and tilt angle θ, the range of the ion beam in the wall of the aperture is:

$$x = \frac{t\tan(\theta) - w}{\sin(\theta)}$$

The special angle for the start of the occultation of the beam ("at limit" in FIG. 17), which corresponds to x=0 is at an angle;

$$\theta = \tan^{-1}(w/t)$$

EXAMPLES

|  | Example 1 | Example 2 | Example 3 |
| --- | --- | --- | --- |
| Aperture diameter, w (nm) | 50 | 20 | 50 |
| Thickness, t (μm) | 10 | 1 | 1 |
| Tilt angle, θ (degrees) | x (μm) | x (μm) | x (μm) |
| 0.286 | 0.00 | | |
| 0.300 | 0.45 | | |
| 0.500 | 4.27 | | |
| 1.000 | 7.14 | | |
| 1.146 | 7.50 | 0.00 | |
| 1.500 | 8.09 | 0.24 | |
| 2.000 | 8.57 | 0.43 | |
| 2.862 | 9.01 | 0.60 | 0.00 |
| 4.000 | 9.31 | 0.72 | 0.29 |
| 5.000 | 9.46 | 0.77 | 0.43 |
| 7.000 | 9.66 | 0.84 | 0.60 |
| 10.000 | 9.87 | 0.90 | 0.73 |

For comparison, the range of 14 keV $^{31}$P in silicon is about 20 nm with a standard deviation of 7 nm. Hence a path length of greater than 100 nm would be sufficient to stop 14 keV $^{31}$P ions. These conditions are in bold in the table.

Large-Field Maskless Lithography

Large field fabrication can take place using a parallel arrangement to dope all sites on a single chip or sub-region. The ion source emits a beam which passes through an injection unit and a multi-electrostatic ion optics unit before passing through a multi-aperatured stencil mask. Individual beams having a divergence of less than 50 micro radians are then passed down onto the substrate. Substrate may be mounted on X-Y stage for indexing in an X-Y plane to impart ions in adjacent chips or regions of the substrate.

A serial approach can also be adopted. In this arrangement the ion source is positioned above condenser optics and a programmable aperture plate. A 200 times reduction stage sits below the aperture, and beneath this the wafer and wafer stage. Using this arrangement single ions can be deposited through apertures in a resist mask one after another as shown at locations 216, 218 and 220 in FIG. 20. Each implantation of a single ion is identified by the current spike in graph 222, and triggers the control system to index the apparatus to the next implantation site. A number of arrangements are possible including use of a focused ion beam without a lens, or a line focus one dimensional lens, electrostatic ions or lenses, wide field two dimensional and any other lenses including a demagnifying electrostatic lens. Ai alternative biasing arrangement may be employed where the surface electrodes 150 are grounded and the signal is taken from the back electrode 160.

Referring to FIG. 21, the implantation site 224 between the gates 226 and 228 of a typical transistor arrangement is repeated across a rectangular grid. Signals are picked off from the grid in the X and Y directions to enable decoding of each ion strike. For instance the ion strike at position 230 is identified by current in $Y_3$ and $X_2$. The coincidence of these two currents can be used to produce a coincidence signal which triggers indexing of the apparatus to the next site. Each charge collection takes 10 ps and the overall process including the coincidence signal takes 0.5 microseconds given a maximum count rate of 200 kHz.

The device bit lines may be used to provide ion strike signals in the X and Y directions. This makes use of the device metallisation and is therefore to some extent self checking of the fabrication process. The accuracy of the method can be determined statistically to provide the probability of one and only one ion being implanted at each location.

Cooling the Substrate

The substrate is also cooled to 115 K to reduce detector noise to an energy equivalent of down to ~1 keV, 0.2 keV is the target. This should enable high certainty that all implanted ions are detected. The optimum temperature is close to the temperature of liquid nitrogen, and many commercial, high sensitivity x-ray detectors are cooled to these temperatures.

Since the collection time is much less than the recombination time close to 100% charge collection is possible. To measure the efficiency of the detectors, we have rastered a focused MeV ion beam across various electrode geometries and monitored the charge collection efficiency at each point [4], finding charge collection efficiencies of ~99% at distances up to 50 μm from the electrodes. We have therefore been able to fabricate detector electrodes set back many microns from the central nanostructured region where the qubits and control gates are located.

The current is integrated in an external, high efficiency cooled preamplifier circuit to produce a single pulse for each ion strike in about 40 ps. This reduction in the thermal noise in the detector and the first stage of the ion detection electronics allows signals from single ion impacts to be detected.

Annealing

Ion strikes create defects due to the nuclear stopping process described earlier. These defects are relatively mobile at room temperature and mobile defects can link up to form extended defects which are difficult to repair by annealing. However our low temperature implantation means that these defects are relatively immobile. So annealing after cold implanting more easily fully repair ion-induced damage.

Damage to the substrate caused by the implant process is removed by a 950° C. rapid thermal anneal (RTA) for 5 seconds. This treatment is also sufficient to activate the phosphorus donors [5] bit limits their diffusion to ~1 nm based on standard bulk rates [6]. Pulsed focused laser annealing on ms timescales could also be used to further limit phosphorus diffusion and to localise the region of beating. The lateral drift of the dopants during annealing was limited to the same order of magnitude as the straggle in the implantation process.

Implanted Position

To estimate the spacings in test devices we have used an implant modelling package [2] to calculate the expected ion straggle. For 14 keV $^{31}P^+$ ions incident on a silicon substrate with a 5 nm $SiO_2$ gate oxide we find that the ions come to rest 20 nm below the free surface, with a standard deviation of 10 nm in the beam direction and 7 nm in the lateral direction.

Detector Testing

For applications such as construction of a quantum computer, where shallow arrays of $^{31}P$ are required, it is necessary to use an initial kinetic energy of less than 15 keV. Therefore it is necessary to know the stopping power; of these ions in silicon at this energy. Unfortunately, the data base of stopping powers used in SRIM2003 does not extend to this low energy. Consequently an extrapolation from known stopping powers measured for ions with an energy considerably greater than 15 keV is required. A summary of the experimental tests performed to date is shown in the table below. Notice that for each ion, the experimental ionization is considerably less than the extrapolation.

| 5 nm $SiO_2$/Si ION | keV Ionization Primary | Recoils | Total |
|---|---|---|---|
| 14 keV $^{31}P$ | | | |
| SRIM2003 | 1.69 | 3.58 | 5.27 |
| Experiment | | | 3.8 |
| 14 keV $^{40}Ar$ | | | |
| SRIM2003 | 1.48 | 3.59 | 5.07 |
| Experiment | | | 3.0 |
| 2x(7 keV $^{14}N$) = 14 keV $N_2^+$ | | | |
| SRIM2003 | 3.41 | 2.37 | 5.78 |
| Experiment | | | 3.8 |

To estimate the spacings in test devices we have used an implant modelling package [2] to calculate the expected ion straggle. For 14 keV $^{31}P^+$ ions incident on a silicon substrate with a 5 nm $SiO_2$ gate oxide we find that the ions come to rest 20 nm below the free surface, with a standard deviation of 10 nm in the beam direction and 7 nm in the lateral direction.

Implanting Light Ions

The implantation of boron (B) is used to create p-type regions in semiconductor devices. Given that B is a light ion, single ions can easily channel into the crystal substrate and travel deep into the substrate before stopping. This is a problem when it is desired to create shallow junctions; as is normally the case. There are two solutions to this problem:

First, tilting the substrate off-axis during the implant step so that the ions enter the substrate in an essentially random direction and are not captured into the crystal channels.

Second, implanting a molecular ion containing an atom of the light ion. The other atoms in the molecule ("bystander" ions) need to be carefully chosen so that they do not disturb the electrical properties of the device. In the case of B, the molecule $BF_3$ is able to be used. In this case each impact delivers one B and three F atoms to the substrate. The F atoms damage the substrate and disrupt the channeling process. The damaged crystal does not channel the B ions so readily and hence the deep tail in the B distribution due to channeling is effectively suppressed. The F atoms appear to have no effect on the electrical properties of the substrate.

The second method offers several significant advantages for the single ion detection system. This is because the bystander ions produce significant ionization in the substrate that can be detected by the detection system. The following table gives an example of the significant advantages to be gained by the presence of the bystander ions. Note that there needs to be a significant increase in the kinetic energy of the ion because the kinetic energy of the molecule is shared with the ion of interest (B) and the bystander ions (3 F).

| 93 keV $BF_3$ molecular ion implant which gives a useful 15 keV B ion | | |
|---|---|---|
| | Ion | |
| | $^{11}B$ | $^{19}F$ |
| Kinetic Energy (keV) | 15 | 29 |
| Ionization/ion (keV) | 9.2 | 13.7 |
| Total ionization/molecule | 50 keV | |

This idea also has application to the construction of quantum computers. At present we implant 15 keV $^{31}P^+$ ions leading to around 5 keV of ionization in the substrate. If instead we implanted 30 keV $PSi^+$ molecules, then we would effectively double the ionization while leaving the $^{31}P$ ion range the same. This would make each ion impact much easier to detect above the noise level of the detector. The bystander Si ion would be readily accommodated into the lattice of the substrate upon annealing.

Device Finalisation

Electron beam lithography (EBL) is used to pattern a number of Ti/Pt alignment markers on the chip before the implantation process begins. Also at, that time, in a second EBL step, two sub-30 nm apertures are opened in an ion-stopping EMMA resist.

Following ion implantation and activation, the remaining nanocircuitry on the surface of the chip is completed using two further EBL steps. Firstly, Ti/Au control gates are deposited following EBL patterning of a single PMMA layer. We routinely fabricate gate widths of 20-30 nm using this process [7] and have also demonstrated continuous gates as narrow as 12 nm.

Finally, $Al/Al_2O_3$ SETs, to detect electron transfer, are fabricated using a double-angle metallisation process and a bilayer resist [8]. The overall alignment between all levels of this process is better than the width of a control gate (~20 nm).

Because the path taken through the substrate by each implanted ion is different there will be variation in the spatial configuration of each implanted ion. This variation is corrected for by appropriate calibration of the control gate voltages in the finished device.

Latest Experimental Results

The latest experiments demonstrate single ion implantation which employs a high-purity active substrate to count the arrival of single ions and is compatible with the use of nano-scale surface masks.

The method is based on an Ion Beam Induced Charge (IBIC) technique adapt to the keV heavy ion (Z>2) regime. By detecting the ionization created by ion implants this method has been used to count single $^1H^+$ and $^4He^+$ implants in the range 15-30 keV into silicon surface barrier detectors and internally created neutron-induced recoils of $^{28}Si$ ions with an energy above 20 keV. Counting single sub-20 keV implanted heavy ions is challenging because of the pulse height defect. This arises because a fraction of the ion kinetic energy is dissipated by pathways other than ionization.

The experiment employs a high-purity silicon substrate (>18,000 $\Omega$cm) itself as the ion implantation detector. Adjacent to the implantation site we fabricate two surface aluminum detector electrodes which make contact win) two boron-doped p-wells (~$10^{20}$ cm$^{-3}$) (see schematic in FIG. 12). A central implant zone is defined with a surface oxide of 5 nm thickness (confirmed with transmission electron microscopy) and a surrounding region with a field oxide of thickness 200 nm. Unlike a conventional surface barrier detector, no front contact is necessary in the implant site and glancing angle IBIC measurements confirm that the dead layer thickness has an upper bound of 7 nm and hence is nominally the same as the oxide layer thickness. A back contact consisting of an n-type phosphorus-diffused layer ($10^{20}$ cm$^{-3}$) and Al contact completes a PIN structure. The substrate is depleted of charge carriers, ensuring high charge collection efficiency when the two surface electrodes are biased at −20 V. This results in a leakage current of less than 10 pA when the substrate is cooled to below 120 K to reduce the random thermal generation of carriers.

As modeled by SUM, a 14 keV $^{31}P^+$ ion implanted into Si (with 5 nm $SiO_2$ surface layer) has a mean depth of 20 nm with a lateral and longitudinal straggle of 8 and 11 nm respectively. Only 34% of the initial kinetic energy produces ionization (which includes the contribution from the substrate Si recoils). Each implant will liberate about 1000 e−/h+ pairs which drift in the internal electric field and induce a transient charge on the electrodes of duration 500 ns as calculated using modeling packages for ion implantation (SRIM) and semiconductor devices TCAD.

To register the transient sign atom ion impacts, the electrodes are coupled to a cooled MOXTEK 4-terminal JFET MX20 with an integrated transistor resetting circuit. An external preamplifier module controls the JFET which is coupled to an ORTEC 672 spectroscopy amplifier which provides an analog pulse with a time constant of ~1 μs and amplitude in proportion to the integrated charge induced in the electrodes. A multichannel analyzer or a sampling storage oscilloscope (sample interval 0.04 μs) is used to sample each transient to confirm the correct pulse shape consistent with ion impacts. For low noise operation (<1.5 keV) it was necessary to acoustically isolate the sample stage and electronics and to mount the substrate on a ceramic holder that had the added advantage that it also reduced the input capacitance of the JFET with a consequent noise reduction. For pristine devices the collection time is much less than the recombination time so close to 100% charge collection is possible even for keV ion impacts. Post-implant, a 5 second rapid thermal anneal to 950° C. is necessary to repair damage and activate the implanted donors.

To optimize the detector electrode design, the efficiency was measured for various geometries with a rastered, focused 2 MeV He$^+$ ion beam to map the charge collection efficiency at each point. In this case each ion impact creates 550,000 e–/h+ pairs allowing convenient measurements at room temperature with conventional electronics. Measured charge collection efficiencies were found to be greater than that of a reference Hammamatsu silicon pin photodiode (which has a relatively thick dead layer) at lateral distances up to 50 μm from the surface electrodes. Therefore the detector electrodes could be fabricated more than our present 10 μm from the implant zone, allowing convenient fabrication of nanocircuitry above the implant site.

Prior to use for single ion counting, the detection system was thoroughly tested by irradiation with the K$_\alpha$ and K$_\beta$ x-rays from $^{55}$Mn (5.894 and 6.489 keV respectively) each of which produce a similar number of e–/h+ pairs as a single 14 Rev $^{31}$P impact but otherwise do no lattice damage to the substrate. A multichannel analyzer produces an x-ray pulse height (energy) spectrum which demonstrates that the substrate is sufficiently sensitive to detect single ions. The results show considerable incomplete charge collection, as expected, owing to the small scale of the sensitive volume near the electrodes of the substrate in comparison to the larger volume irradiated by the x-rays. Some low energy x-rays from the source also contributed to the noise threshold. Nevertheless the spectrum is characteristic of a viable device for detection of single ion implants because it shows a system noise threshold of 1.1 keV or better.

Using a test device with a 10 μm-square construction zone (with thin 5 nm SiO$_2$), a 14 keV $^{31}$P$^+$ pulse height spectrum was obtained from the charge transients of more than 6000 ion impacts. Due to statistical variations in ion trajectories the exact number of e–/h+ pairs and the resulting pulse height vary between events. However more than 98% of the signals are above the noise threshold showing that single ion impacts can be reliably detected.

The implant zone is surprisingly robust to ion implantation. Ion implant damage in the surface 20 nm of the substrate was expected to rapidly degrade the ion signal. Instead we found a gradual reduction in the pulse height; with some evidence of saturation of the signal presumably when the surface silicon layer (down to the ion range) is uniformly damaged by ion impacts leading to charge trapping and recombination. Fitting an exponential to the shift in the peak centroid as a function of ion fluence suggests that each ion effectively deactivates a 40±4 nm diameter area that can be assumed to extend in depth to the 20 nm end of range of the incident ions.

Further tests were done with devices configured with a 150 nm thick polymethyl-methacrylate (PMMA) mask containing apertures exposed in the mask using e-beam lithography (EBL) and standard development processes. This thickness is sufficient to stop all 14 keV $^{31}$P$^+$ ions from entering the substrate as well as the forward recoils from the atoms in the resist. A mask containing 400 apertures, each 20 nm in diameter, was used to detect ~750 ion impacts (~two impacts per aperture) without a discernable change in the peak centroid, showing that induced charge can escape the damaged region created by a first ion impact to yield a measurable signal from a subsequent ion impact.

This technique can be used in conjunction with a masked device configured with two 20 nm apertures to fabricate a two donor device. The device is then subjected to ion bombardment with a broad area beam (we used 200 μm diameter) until two ion impacts are counted from the electrode signals. Ions which are stopped by the mask do not result in any electrode signals.

At present we are applying a uniform areal ion dose to our masked substrates, so that ion placement is random between the apertures. For test devices intended to realize Si:P charge qubits[3], this leads to 50% probability of correctly configuring a device with one P atom at each site, sufficient for proof-of-principle experiments. However, for large-scale donor arrays it will be necessary to direct each ion to its appropriate EBL-machined are at its array site using a FIB, in particular a dual beam FIB/SEM with a 20 nm focus. Because the path taken through the substrate by each implanted ion is different owing to straggling, there will be variation in the spatial configuration of each P atom, but this can, in principle, be corrected for by appropriate calibration of the associated gate voltages.

At present the lower limit of the ion energy which can be reliably detected is governed by the noise in the detection circuit which is a function of the detector capacitance, leakage current and externally induced acoustic noise. With optimization of the electrode structure to reduce the leakage current and better capacitance matching between the detector and preamplifier electronics we estimate that the noise level could be less than 0.5 keV allowing sub-14 keV $^{31}$P ions to be counted with high confidence.

REFERENCES

[1] C I Pakes, D P George, D N Jamieson, C Yang, A S Dzurak E Gauja, and R G Clark, Technology computer aided design modeling of single atom doping for fabrication of buried nanostructures *Nanotechnology* 14, 157 (2003).

[2] J F Ziegler, J P Biersack, and U Littmark, SRIM—The Stopping and Range of Ions in Solids Pergamon Press, New York (1985).

[3] TCAD—Technology Computer Aided Design, Integrated Systems Engineering A G, Zurich.

[4] C Yang, D N Jamieson, S M Hearne, C I Pakes, B Rout, E Gauja, A S Drunk, and R G Clark, Ion-beam-induced charge characterisation of particle detectors *Nucl. Instrum. Meth. B* 190, 212 (2002).

[5] V E Borisenko, and P J Hesketh, Rapid Thermal Processing of Semiconductors Plenum Press, New York (1997).

[6] Intrinsic diffusivity calculated for P with values taken from: P M Fahey, P B Griffin, and J D Plummer, Defects and dopant division in silicon *Rev. Mod. Phys.* 61, 289 (1989).

[7] We have confirmed the reliable low-temperature conductivity at 4.2 K of these narrow Ti/Au gates using separate structures.

[8] T A Fulton, and G J Dolan, Observation of single-electron charging effects in small tunnel junctions *Phys. Rev. Lett.* 59, 109 (1987).

[9] R J Schoelkopf, P Wahlgren, A A Kozhevnikov, P Delsing, and D E Prober, The Radio-Frequency Single-Electron Transistor (RF-SBT): A Fast and Ultrasensitive Electrometer *Science* 280, 1238 (1998).

[10] A Aassime, G Johansson, G Wendin, R J Schoelkopf, and P Delsing, Radio-frequency single-electron transistor as readout device for qubits: charge sensitivity and backaction *Phys. Rev. Lett.* 86, 3376 (2001).

[11] L C L Hollenberg, A S Dzurak, C Wellard, A R Hamilton, D J Reilly, G J Milburn and R G Clark, Charge-based quantum computing using single donors in semiconductors, *Physical Review B* 69, 113301 (2004).

[12] J F Ziegler, J P Biersack and U Littmark, SRIM—The Stopping and Range of Ions in Solids Pergamon Press, New York (1985).

[13] T M Buehler, D J Reilly, R Brenner, A R Hamilton, A S Dzurak; and R G Clark, Correlated charge detection for readout of a solid-state quantum computer *Appl. Phys. Lett.* 82, 577 (2003).

[14] K W Lehnert, K Bladh, L F Spietz, D Gunnarsson, D I Schuster, P Delesing, and R J Schoelkopf, Measurement of the excited-state lifetime of a microelectronic circuit *Phys. Rev. Lett.* 90, 027002 (2003).

[15] T M Buehler, D J Reilley, R P Starrett, A R Hamilton, A S Dzurak, and R G Clark, Development and operation of a radio frequency twin-SET for solid-state qubit readout *arXiv:cond-mat/*0302085 (2003).

[16] T M Buehler, D J Reilly, R P Starrett, A D Greentree, A R Hamilton, A S Dzurak, and R G Clark, Efficient readout with the radio frequency single electron transistor in the presence of charge noise *arXiv:cond-mat/*0304384 (2003).

[17] A A Clerk, S M Girvin, A K Nguyen, and A D Stone, Resonant Cooper-Pair Tunneling: Qunatum Noise and Measurement Characteristics *Phys. Rev. Lett.* 89, 176804 (2002).

[18] M H Devoret, and R J Schoelkopf, Amplifying quantum signals with the single-electron transistor *Nature* 406, 1039 (2000).

[19] N S Saks, Measurement of single interface trap cross sections with charge pumping *Appl. Phys. Lett.* 70, 3380 (1997).

It will be appreciated by persons skilled in the art that numerous variations and/or modifications may be made to the invention as shown in the specific embodiments without departing from the spirit or scope of the invention as broadly described the present embodiments are, therefore, to be considered in all respects as illustrative and not restrictive.

The invention claimed is:

1. A semiconductor device comprising:
   a semiconductor substrate;
   one or more doped surface regions of the substrate;
   metallization over the doped surface regions to form electrodes; and,
   a zone of substantially intrinsic semiconductor where a counted number of dopant ions have been implanted.

2. A semiconductor device according to claim 1, wherein the device has a Schottky, PIN, NIP, PIP or NIN detector architecture.

3. A semiconductor device according to claim 2, comprising a PIN device having two surface electrodes; wherein, each electrode is positioned over a respective p-type doped surface well in a substrate, and under the substrate is an n-type doped back electrode and a back contact layer; and wherein, the substrate comprises substantially intrinsic semiconductor in a zone of which between the surface wells there are a counted number of dopant ions.

4. A semiconductor device according to claim 1, comprising a metal-oxide-semiconductor-field-effect transistor (MOSFET) having a channel region of substantially intrinsic semiconductor in which there are a counted number of dopant ions.

5. A semiconductor device according to claim 1, wherein the structure has an n- or p-doped back plane.

* * * * *